United States Patent
Hiew et al.

(10) Patent No.: US 7,872,871 B2
(45) Date of Patent: Jan. 18, 2011

(54) MOLDING METHODS TO MANUFACTURE SINGLE-CHIP CHIP-ON-BOARD USB DEVICE

(75) Inventors: Siew S. Hiew, San Jose, CA (US); Jim C. Ni, San Jose, CA (US); Charles C. Lee, Cupertino, CA (US); I-Kang Yu, Palo Alto, CA (US); Ming-Shiang Shen, Taipei-Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 816 days.

(21) Appl. No.: 11/773,830

(22) Filed: Jul. 5, 2007

(65) Prior Publication Data

US 2007/0293088 A1  Dec. 20, 2007

Related U.S. Application Data

(63) Continuation-in-part of application No. 11/309,594, filed on Aug. 28, 2006, now Pat. No. 7,383,362, and a continuation-in-part of application No. 10/707,277, filed on Dec. 2, 2003, now Pat. No. 7,103,684, and a continuation-in-part of application No. 11/112,501, filed on Apr. 21, 2005, now Pat. No. 7,269,004, and a continuation-in-part of application No. 10/907,700, filed on Apr. 12, 2005, now Pat. No. 7,297,024, and a continuation-in-part of application No. 11/466,759, filed on Aug. 23, 2006, now Pat. No. 7,702,831, and a continuation-in-part of application No. 09/478,720, filed on Jan. 6, 2000, now Pat. No. 7,257,714, and a continuation-in-part of application No. 11/458,987, filed on Jul. 20, 2006, now Pat. No. 7,690,030, and a continuation-in-part of application No. 10/789,333, filed on Feb. 26, 2004, now Pat. No. 7,318,117.

(51) Int. Cl.
H05K 7/02 (2006.01)

(52) U.S. Cl. ............... 361/730; 361/737; 361/752; 439/76.1; 439/660

(58) Field of Classification Search ........... 361/737, 361/730, 752; 439/76.1, 660
See application file for complete search history.

(56) References Cited

U.S. PATENT DOCUMENTS 4,671,587 A  6/1987  Lerner et al.

(Continued)

Primary Examiner—Dameon E Levi
(74) Attorney, Agent, or Firm—Bever, Hoffman & Harms, LLP; Patrick T. Bever

(57) ABSTRACT

A low-profile Universal-Serial-Bus (USB) device includes a PCBA in which all passive components and unpackaged IC chips are attached to a single side of a PCB opposite to the metal contacts. The IC chips include, for example, a USB controller chip and a flash memory chip, or a single-chip (combined USB controller/flash memory) chip. Multiple flash IC chips are optionally stacked to increase storage capacity. The IC chip(s) are attached to the PCB by wire bonding or other chip-on-board (COB) technique. The passive components are attached by conventional surface mount technology (SMT) techniques. A molded housing is then formed over the IC chips and passive components such that the device has a uniform thickness. The low-profile USB device is optionally used as a modular insert that is mounted onto a metal case to provide a USB assembly having a plug shell similar to a standard USB male connector.

29 Claims, 18 Drawing Sheets

U.S. PATENT DOCUMENTS

| | | |
|---|---|---|
| 5,385,479 A | 1/1995 | Okada |
| 5,397,857 A | 3/1995 | Farquhar et al. |
| 5,404,485 A | 4/1995 | Ban |
| 5,414,597 A | 5/1995 | Lindland et al. |
| 5,430,859 A | 7/1995 | Norman et al. |
| 5,479,638 A | 12/1995 | Assar et al. |
| 5,530,622 A | 6/1996 | Takiar et al. |
| 5,623,552 A | 4/1997 | Lane |
| 5,754,397 A | 5/1998 | Howell et al. |
| 5,821,614 A | 10/1998 | Hashimoto et al. |
| 5,835,760 A | 11/1998 | Harmer |
| 5,959,541 A | 9/1999 | DiMaria et al. |
| 6,000,006 A | 12/1999 | Bruce et al. |
| 6,012,636 A | 1/2000 | Smith |
| 6,044,428 A | 3/2000 | Rayabhari |
| 6,069,920 A | 5/2000 | Schulz et al. |
| 6,125,192 A | 9/2000 | Bjorn et al. |
| 6,148,354 A | 11/2000 | Ban et al. |
| 6,193,152 B1 | 2/2001 | Fernando et al. |
| 6,231,363 B1 | 5/2001 | Kosmala |
| 6,241,534 B1 | 6/2001 | Neer et al. |
| 6,292,863 B1 | 9/2001 | Terasaki et al. |
| 6,297,448 B1 | 10/2001 | Hara |
| 6,313,400 B1 | 11/2001 | Mosquera et al. |
| 6,321,478 B1 | 11/2001 | Klebes |
| 6,438,638 B1 | 8/2002 | Jones et al. |
| 6,475,830 B1 | 11/2002 | Brillhart |
| 6,490,163 B1 | 12/2002 | Pua et al. |
| 6,567,273 B1 | 5/2003 | Liu et al. |
| 6,573,567 B1 | 6/2003 | Nishizawa et al. |
| 6,615,404 B1 | 9/2003 | Garfunkel et al. |
| 6,618,243 B1 | 9/2003 | Tirosh |
| 6,624,005 B1 | 9/2003 | DiCaprio et al. |
| 6,671,808 B1 | 12/2003 | Abbott et al. |
| 6,676,420 B1 | 1/2004 | Liu et al. |
| 6,718,407 B2 | 4/2004 | Martwick |
| 6,733,329 B2 | 5/2004 | Yang |
| 6,757,783 B2 | 6/2004 | Koh |
| 6,763,410 B2 | 7/2004 | Yu |
| 6,773,192 B1 | 8/2004 | Chao |
| 6,778,401 B1 | 8/2004 | Yu et al. |
| 6,832,281 B2 | 12/2004 | Jones et al. |
| 6,854,984 B1 * | 2/2005 | Lee et al. ................ 439/79 |
| 6,900,988 B2 | 5/2005 | Yen |
| 6,922,343 B2 | 7/2005 | Nakanishi et al. |
| 6,932,629 B2 | 8/2005 | Ikenoue |
| 6,940,153 B2 | 9/2005 | Spencer et al. |
| 6,944,028 B1 | 9/2005 | Yu et al. |
| 6,979,210 B2 | 12/2005 | Regen et al. |
| 6,980,188 B1 | 12/2005 | Worley, III et al. |
| 7,004,780 B1 | 2/2006 | Wang |
| 7,009,847 B1 | 3/2006 | Wu et al. |
| 7,011,247 B2 | 3/2006 | Drabczuk et al. |
| 7,035,110 B1 * | 4/2006 | Wang et al. ............... 361/737 |
| 7,048,197 B2 | 5/2006 | Nishizawa et al. |
| 7,055,757 B2 | 6/2006 | Nishizawa et al. |
| 7,059,871 B1 | 6/2006 | Hsiao |
| 7,104,809 B1 | 9/2006 | Huang |
| 7,153,148 B2 | 12/2006 | Chen et al. |
| 7,224,052 B2 | 5/2007 | Nishizawa et al. |
| 7,234,644 B2 | 6/2007 | Nishizawa et al. |
| 7,259,967 B2 * | 8/2007 | Ni .............................. 361/760 |
| 7,269,004 B1 * | 9/2007 | Ni et al. ................. 361/679.41 |
| 7,296,098 B2 | 11/2007 | Shih |
| 7,361,032 B2 | 4/2008 | Loftus |
| 7,364,090 B2 | 4/2008 | Cuellar et al. |
| 7,375,975 B1 | 5/2008 | Jang et al. |
| 7,416,419 B2 | 8/2008 | Collantes, Jr. et al. |
| 7,422,454 B1 | 9/2008 | Tang et al. |
| 7,462,044 B1 | 12/2008 | Regen et al. |
| 7,473,112 B2 | 1/2009 | Zhu et al. |
| 7,547,961 B2 | 6/2009 | Nishizawa et al. |
| 7,608,787 B2 * | 10/2009 | Takemoto et al. ........... 174/260 |
| 7,616,447 B2 | 11/2009 | Yamada et al. |
| 7,652,892 B2 * | 1/2010 | Shiu et al. ................... 361/752 |
| 7,709,946 B2 * | 5/2010 | Ryu et al. .................... 257/692 |
| 2001/0038547 A1 | 11/2001 | Jigour et al. |
| 2001/0043174 A1 | 11/2001 | Jacobsen et al. |
| 2002/0036922 A1 | 3/2002 | Roohparvar |
| 2002/0116668 A1 | 8/2002 | Chhor et al. |
| 2002/0166023 A1 | 11/2002 | Nolan et al. |
| 2003/0038043 A1 | 2/2003 | Painsith |
| 2003/0046510 A1 | 3/2003 | North |
| 2003/0100203 A1 | 5/2003 | Yen |
| 2003/0163656 A1 | 8/2003 | Ganton |
| 2003/0177300 A1 | 9/2003 | Lee et al. |
| 2003/0182528 A1 | 9/2003 | Ajiro |
| 2003/0198028 A1 | 10/2003 | Nakanishi et al. |
| 2003/0207601 A1 | 11/2003 | Adachi |
| 2003/0223286 A1 | 12/2003 | Lee |
| 2004/0034765 A1 | 2/2004 | James |
| 2004/0066693 A1 | 4/2004 | Osako et al. |
| 2004/0087213 A1 | 5/2004 | Kao |
| 2004/0137664 A1 | 7/2004 | Elazar et al. |
| 2004/0143716 A1 | 7/2004 | Hong |
| 2004/0145875 A1 | 7/2004 | Yu et al. |
| 2004/0148482 A1 | 7/2004 | Grundy et al. |
| 2004/0153595 A1 | 8/2004 | Sukegawa et al. |
| 2004/0255054 A1 | 12/2004 | Pua et al. |
| 2005/0009388 A1 | 1/2005 | Chao |
| 2005/0114587 A1 | 5/2005 | Chou et al. |
| 2005/0182858 A1 | 8/2005 | Lo et al. |
| 2005/0193161 A1 | 9/2005 | Lee et al. |
| 2005/0193162 A1 | 9/2005 | Chou et al. |
| 2005/0216624 A1 | 9/2005 | Deng et al. |
| 2005/0218200 A1 | 10/2005 | Focke et al. |
| 2005/0248926 A1 | 11/2005 | Asom et al. |
| 2005/0254219 A1 | 11/2005 | Nakanishi et al. |
| 2007/0263365 A1 | 11/2007 | Yamada et al. |
| 2008/0093720 A1 | 4/2008 | Hiew et al. |
| 2008/0094807 A1 | 4/2008 | Hiew et al. |

* cited by examiner

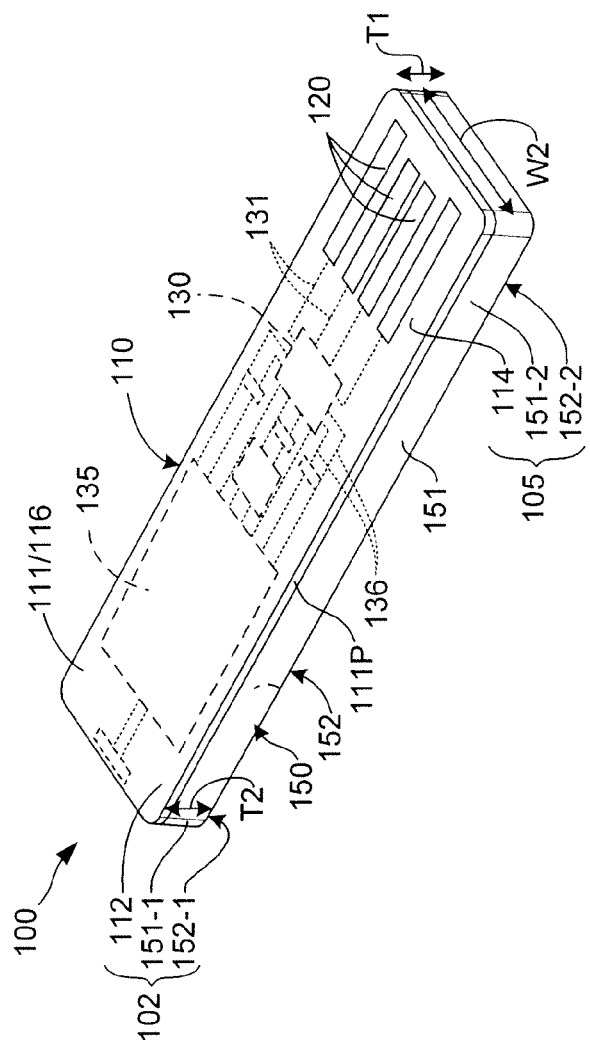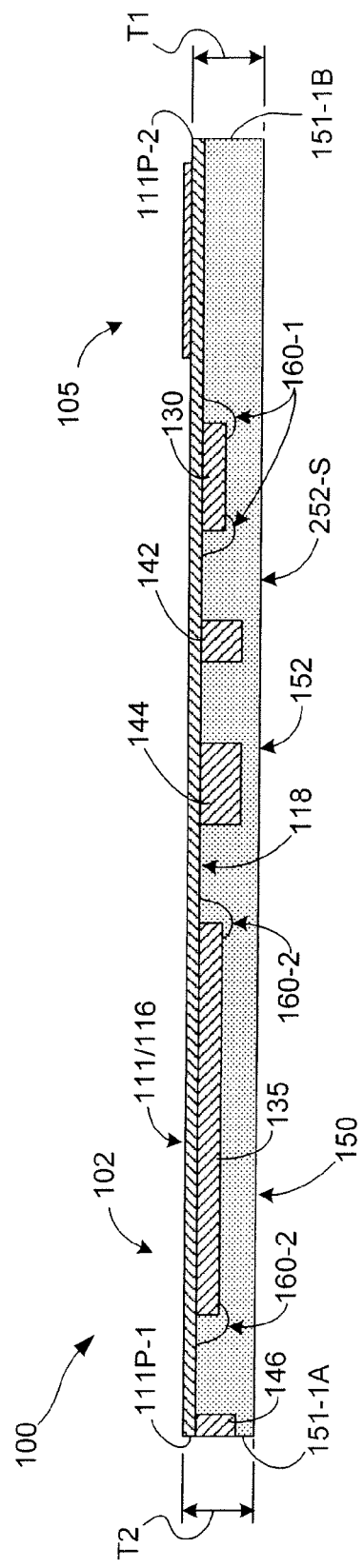
FIG. 1(A)
FIG. 1(B)

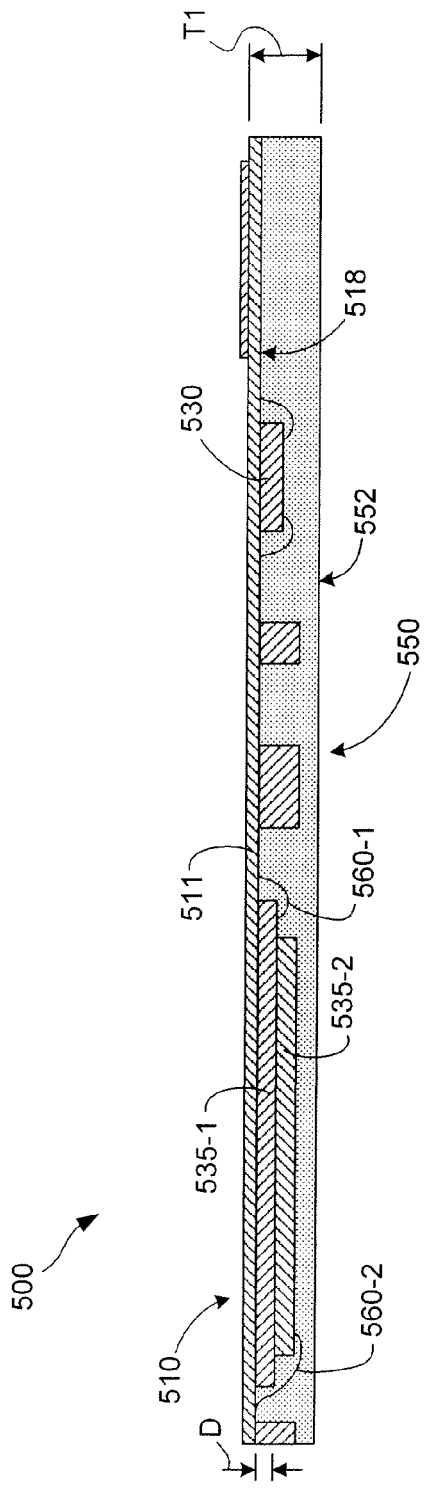
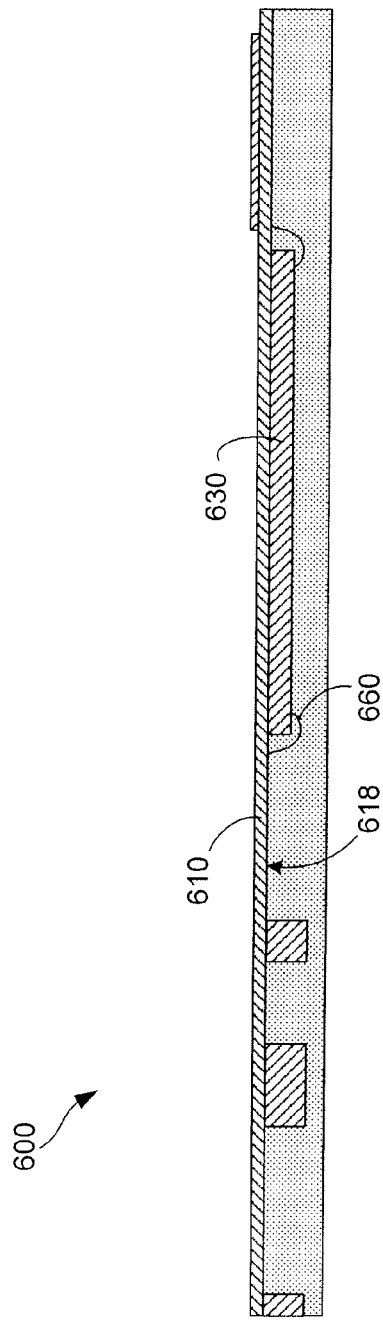

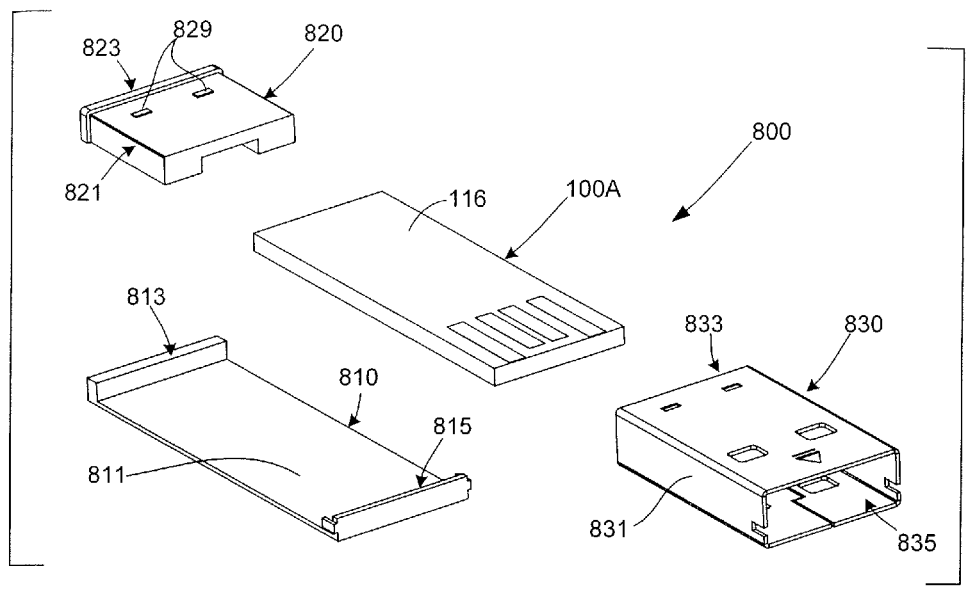
FIG. 23(A)
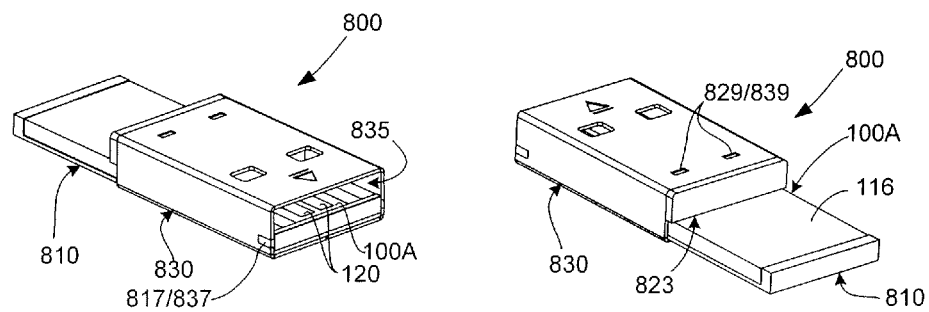
FIG. 23(B)          FIG. 23(C)

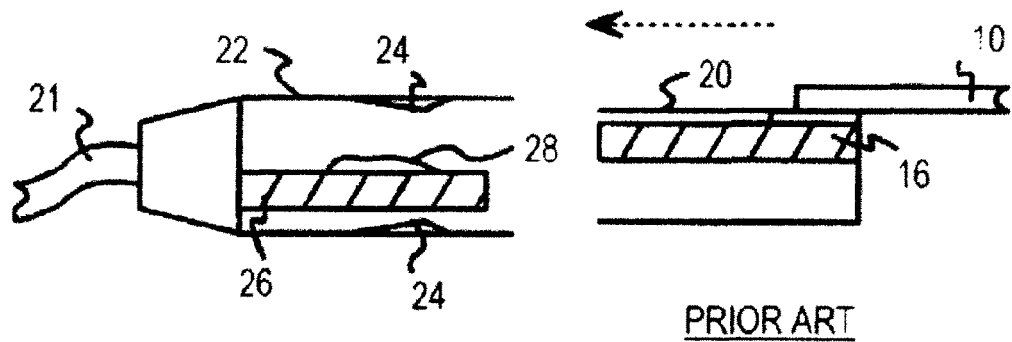
FIG. 25(A) PRIOR ART
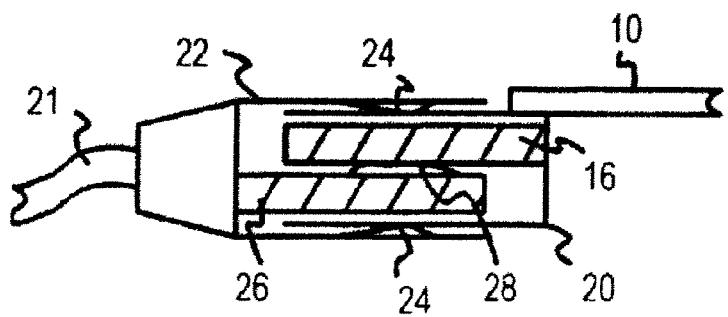
PRIOR ART FIG. 25(B)

MOLDING METHODS TO MANUFACTURE SINGLE-CHIP CHIP-ON-BOARD USB DEVICE

RELATED APPLICATIONS

This application is a continuation-in-part (CIP) of U.S. patent application for "Single-Chip Multi-Media Card/Secure Digital (MMC/SD) Controller Reading Power-On Boot Code from Integrated Flash Memory for User Storage", U.S. application Ser. No. 11/309,594, filed Aug. 28, 2006 now U.S. Pat. No. 7,383,362, which is a CIP of "Single-Chip USB Controller Reading Power-On Boot Code from Integrated Flash Memory for User Storage", U.S. application Ser. No. 10/707,277, filed Dec. 2, 2003, now U.S. Pat. No. 7,103,684.

This application is also a CIP of U.S. patent application for "Low-Profile USB Device", U.S. application Ser. No. 11/112,501, filed on Apr. 21, 2005 now U.S. Pat. No. 7,269,004.

This application is also a CIP of U.S. patent application for "Universal-Serial-Bus (USB) Flash-Memory Device with Metal Wrap Formed over Plastic Housing", U.S. application Ser. No. 10/907,700, filed on Apr. 12, 2005 now U.S. Pat. No. 7,297,024.

This application is also a CIP of U.S. patent application for "Flash Memory Controller for Electronic Data Flash Card", U.S. application Ser. No. 11/466,759, filed Aug. 23, 2006 now U.S. Pat. No. 7,702,831, which is a continuation-in-part of U.S. patent application for "Electronic Data Storage Medium with Fingerprint Verification Capability", U.S. application Ser. No. 09/478,720 filed Jan. 6, 2000 now U.S. Pat. No. 7,257,714.

This application is also a CIP of U.S. patent application for "Electronic Data Flash Card With Fingerprint Verification Capability", U.S. application Ser. No. 11/458,987 filed Jul. 20, 2006 now U.S. Pat. No. 7,690,030, This application is also a CIP of U.S. patent application for "System and Method for Controlling Flash Memory", U.S. application Ser. No. 10/789,333 filed Feb. 26, 2004 now U.S. Pat. No. 7,318,117.

This application is also related to "Narrow Universal-Serial-BUS (USB) Flash-Memory Card with Straight Sides Using a Ball Grid-Array (BGA) Chip", U.S. Ser. No. 10/907,204, filed Mar. 24, 2006.

FIELD OF THE INVENTION

This invention relates to portable electronic devices, and more particularly to portable electronic devices such as those that utilize the Universal-Serial-Bus (USB) specification.

BACKGROUND OF THE INVENTION

Rapid advances in technology in several areas have converged to enable small, portable memory cards with vast capacities. Flash memory technologies such as those using electrically-erasable programmable read-only memory (EEPROM) have produced chips storing 128 M-Bytes or more. Small flash-memory cards have been designed that have a connector that can plug into a specialized reader, such as for compact-flash, secure-digital, memory stick, or other standardized formats.

More recently, flash memory cards are being sold that contain a USB connector. Such USB-flash memory cards do not require a specialized reader but can be plugged into a USB connector on a host system, such as a personal computer (PC). These USB-flash memory cards can be used in place of floppy disks. A USB-flash card can have a capacity of more than ten floppy disks in an area not much larger than a large postage stamp.

FIG. 24(A) shows a prior-art flash-memory card with a conventional male USB connector. Flash memory chip 12 may be a 128 Mega-byte non-volatile chip or may have some other capacity. Controller chip 14 contains a flash-memory controller that generates signals to access memory locations within flash memory chip 12. Controller chip 14 also contains a USB interface controller that serially transfers data to and from flash memory chip 12 over a USB connection.

Male USB connector 20 may be mounted on board 10, which is a small circuit board with chips 12, 14 mounted thereon. Multi-layer printed-circuit board (PCB) technology can be used for board 10. A plastic case (not shown) can surround board 10.

Male USB connector 20 contains a small connector substrate 16, which is often white ceramic, black rigid plastic, or another sturdy substrate. Connector substrate 16 has four or more metal contacts 18 formed thereon. Metal contacts 18 carry the USB signals generated or received by controller chip 14. USB signals include power, ground, and serial differential data D+, D−.

Male USB connector 20 contains a metal case that wraps around connector substrate 16. The metal case touches connector substrate 16 on three of the sides of connector substrate 16. The top side of connector substrate 16, holding metal contacts 18, has a large gap to the top of the metal case. On the top and bottom of this metal wrap are formed holes 15. USB connector 20 is a type-A USB connector.

FIG. 24(B) shows a female USB socket connector 22. Female USB socket connector 22 can be an integral part of a PC or other host system, or can be connected by cable 21 to such a host system. Another connector substrate 26 contains four metal contacts 28 that make electrical contact with the four metal contacts 18 of the male USB connector 20 of FIG. 24(A). Connector substrate 26 is wrapped by a metal case, but small gaps are between the metal case and connector substrate 26 on the lower three sides.

Locking is provided by metal springs 24 in the top and bottom of the metal case. When male USB connector 20 of FIG. 25(A) is flipped over and inserted into Female USB socket connector 22 of FIG. 25(B), metal springs 24 lock into holes 15 of male USB connector 20.

FIGS. 25(A) and 25(B) are cross-sections highlighting connections between male and female USB connectors. Female USB socket connector 22 is on the left while male USB connector 20 is being inserted from the right. Male USB connector 20 is flipped over relative to the view of FIG. 24(A). Metal contacts 18 are formed on the lower surface of connector substrate 16 on male USB connector 20, while metal contacts 28 are formed on the upper surface of connector substrate 26 on Female USB socket connector 22. Thus the metal contacts face one another to allow for electrical contact when male USB connector 20 is inserted into Female USB socket connector 22 as shown in FIG. 25(B).

Metal springs 24 formed on the metal case surrounding connector substrate 26 on Female USB socket connector 22 fit into holes on the metal case of male USB connector 20. This helps to lock the connectors together.

FIG. 26 shows a prior-art USB flash memory card using a low-profile USB connector. Male USB connector 20 of FIGS. 25 and 26 is relatively large. The metal case in particular is cumbersome and increases manufacturing cost. Costs may be reduced by integrating male USB connector 30 with board 32. Board 32 is a PCB that has flash memory chip 12 and controller chip 14 mounted thereon. Board 32 is extended to include male USB connector 30, which has metal contacts 38 formed on end 36 of board 32.

The width and thickness of board 32 at end 36 containing male USB connector 30 is designed to approximately match that of connector substrate 16 of FIG. 24(A). Plastic case 34 can enclose board 32 but have an opening for metal contacts 38. Plastic case 34 can cover the bottom and sides of male USB connector 30 up to end 36 to emulate potions of the metal case of the male USB connector of FIG. 24(A).

FIGS. 27(A) and 27(B) show cross-sections of the prior-art low-profile USB connector being inserted into a standard Female USB connector. Board 32 that has male USB connector 30 formed on end 36 is flipped over from the view shown in FIG. 26, and end 36 is inserted into female USB socket connector 22 from the right side.

Metal contacts 38 are located on the lower surface of male USB connector 30. Plastic case 34 has an opening on the lower surface of male USB connector 30 to expose the metal contacts so they can make electrical connection with metal contacts 28 on the upper surface of connector substrate 26 of Female USB socket connector 22 when inserted as shown in FIG. 27(B).

Plastic case 34 helps to fill the gate between board 32 and the top edge of the metal case of Female USB socket connector 22. However, no holes are provided in plastic case 34, so metal springs 24 are pushed up slightly when male USB connector 30 is inserted into Female USB socket connector 22. Plastic case 34 is also formed along the thin edges of board 32 and helps to fill in the gaps between connector substrate 26 and the sides of the metal case of Female USB socket connector 22 that are above and below the plane of FIG. 27(B).

While low-profile USB connector 30 can be less expensive and smaller than the standard USB connector, it still has an undesirable thickness. The lack of the metal case facilitates some reduction in size at the plug end, but conventional fabrication processes mount the USB ICs on the same side of the PCB as the metal contacts, thus producing a body (handle) that is relatively thick.

What is needed is a substantially flat, low-profile male USB device having a minimal handle thickness, thus facilitating extremely thin USB devices that can be incorporated into pocket-carried items, such as key chains and pocket utility tools. What is also needed is a method for manufacturing such low-profile USB devices.

SUMMARY OF THE INVENTION

The present invention is directed to a short, low-profile USB device in which the thickness of the USB device's handle structure is substantially equal to and coplanar with a low-profile "(half-height)" thickness of the USB device's plug structure. The low-profile plug structure thickness is determined by the plug receiving space located between the metal contacts and metal casing of a standard female USB socket connector, and the plug structure also has a width that is equal to the corresponding width of the plug receiving space defined by the standard female USB socket connector, thereby facilitating a snug (secure) fit between the plug structure and the standard female USB socket connector. To minimize the overall thickness of the USB device to the thickness of the plug structure, a PCBA is provided that includes metal contacts formed on a first (e.g., upper) surface of a PCB, and all IC components (e.g., USB controller chip, flash memory chip, etc.) mounted on the opposite (e.g., lower) surface of the PCB. A housing is then molded over the IC components (i.e., over the lower surface of the PCBA) that includes a plug section extending opposite to the metal contacts to provide the necessary plug structure thickness, and a handle section that covers the IC components. The housing has a planar surface that is parallel to the PCB and extends along the entire length of the USB device (e.g., from a front edge of the plug structure to a rear edge of the handle structure). Accordingly, the thickness of the handle structure is made substantially equal to the plug structure thickness, which is required for secure and reliable connection to a standard female USB socket connector, thus producing a flat, low-profile (thin) structure that can be easily carried in a user's pocket, or incorporated into a utility tool.

According to an aspect of the invention, passive components are mounted onto the PCB using one or more standard surface mount technology (SMT) techniques, and one or more integrated circuit (IC) die (e.g., an USB controller IC die and a flash memory die) are mounted using chip-on-board (COB) techniques. During the SMT process, the SMT-packaged passive components (e.g., capacitors, oscillators, and light emitting diodes) are mounted onto contact pads disposed on the PCB, and then known solder reflow techniques are utilized to connect leads of the passive components to the contact pads. During the subsequent COB process, the IC dies are secured onto the PCB using know die-bonding techniques, and then electrically connected to corresponding contact pads using, e.g., known wire bonding techniques. After the COB process is completed, the housing is formed over the passive components and IC dies using plastic molding techniques. By combining SMT and COB manufacturing techniques to produce low-profile USB devices, the present invention provides several advantages over conventional manufacturing methods that utilize SMT techniques only. First, by utilizing COB techniques to mount the USB controller and flash memory, the large PCB area typically taken up by SMT-packaged controllers and flash devices is dramatically reduced, thereby facilitating significant miniaturization of the resulting USB device footprint (i.e., providing a shorter device length and thinner device width). Second, the IC die height is greatly reduced, thereby facilitating stacked memory arrangements that greatly increase memory capacity of the USB devices without increasing the USB device footprint. Further, overall manufacturing costs are reduced by utilizing unpackaged controllers and flash devices (i.e., by eliminating the cost associated with SMT-package normally provided on the controllers and flash devices). Moreover, the molded housing provides greater moisture and water resistance and higher impact force resistance than that achieved using conventional manufacturing methods. Therefore, the combined COB and SMT method according to the present invention provides a less expensive and higher quality (i.e., more reliable) memory product with a smaller size than that possible using conventional SMT-only manufacturing methods.

According to an embodiment of the invention, a low-profile USB device utilizes a single-chip controller/flash die that includes both a controller circuit and one or more flash block mass storage circuits that are interconnected by a bus. The controller circuit includes an input/output (I/O) interface circuit that facilitates sending and receiving commands and data to/from a host, and a flash-memory controller that facilitates sending and receiving sends data over the internal bus to/from the flash mass storage blocks. By combining the controller and flash memory circuits, external pins are not required, thereby further reducing the PCB area required for controller and flash memory devices, thus facilitating further miniaturization of USB devices formed in accordance with the present invention.

In accordance with another aspect of the present invention the short, low-profile USB device described above is utilized as a modular component in the construction of larger USB assemblies. For example, in one embodiment, the short, low-profile USB device is mounted inside a full metal case that entirely surrounds the USB device and provides a standard plug shell around the plug portion of the USB device (i.e., such that the metal contacts formed on the USB device are accessible through a front opening defined in the full metal case). In another embodiment, the USB device is mounted inside a smaller ("half") metal case that surrounds only the plug portion of the USB device. In each embodiment, plastic parts are assembled to fixedly connect the USB device to the metal case. A crimping tool is used to form depressions in the metal case that facilitate locking the low-profile USB device into place. Thus, the present invention facilitates the production of low-cost, highly reliable, high capacity USB apparatus having aesthetic casing designs that easily and conveniently incorporate the short, low-profile USB device as core component.

BRIEF DESCRIPTION OF THE DRAWINGS

These and other features, aspects and advantages of the present invention will become better understood with regard to the following description, appended claims, and accompanying drawings, where:

FIGS. 1(A) and 1(B) a perspective top and cross sectional side views showing an exemplary USB device according to an embodiment of the present invention;

FIG. 18 is simplified cross-sectional side view showing an USB device including stacked-memory according to another embodiment of the present invention;

FIG. 19 is simplified cross-sectional side view showing a single-chip USB device according to another embodiment of the present invention;

FIGS. 23(A), 23(B) and 23(C) are exploded perspective, front assembled perspective and rear assembled perspective views showing a USB assembly with a half metal case according to another embodiment of the present invention;

FIGS. 25(A) and 25(B) are cross-sections highlighting connections between male and female USB connectors;

DETAILED DESCRIPTION OF THE DRAWINGS

Figure 2A:
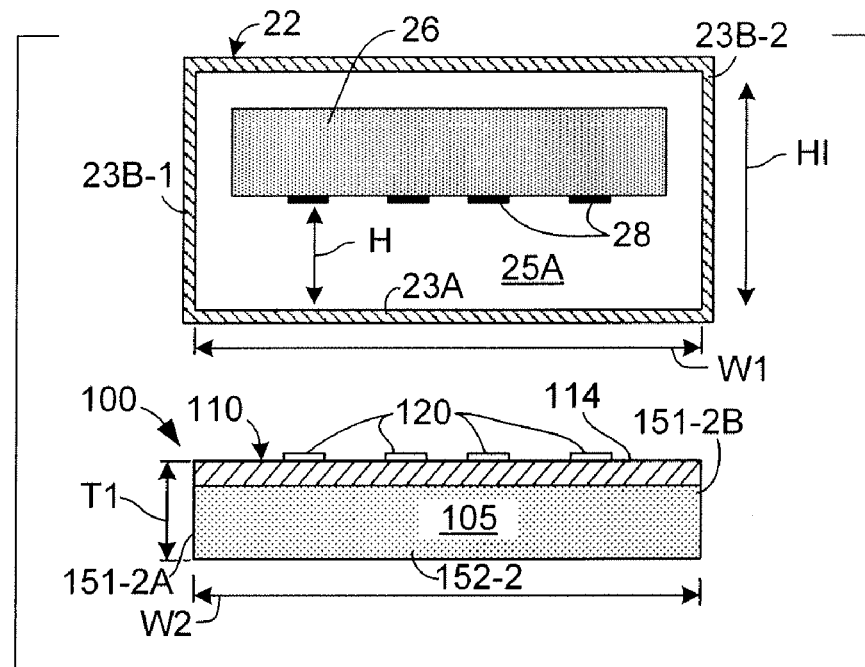
FIGS. 2(A) and 2(B) are cross-sectional end views showing a standard female USB socket connector and the plug structure of the USB device of FIG. 1 in separated and assembled conditions, respectively.

The present invention relates to an improvement in low-profile USB connectors. The following description is presented to enable one of ordinary skill in the art to make and use the invention as provided in the context of a particular application and its requirements. As used herein, the terms "upper", "upwards", "lower", and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIGS. 1(A) and 1(B) are perspective and cross-sectional side views showing a low-profile Universal-Serial-Bus (USB) device 100 according to a first embodiment of the present invention. USB device 100 generally includes a printed circuit board assembly (PCBA) 110 and a plastic housing 150 that is molded onto PCBA 110. Referring to the upper portion of FIG. 1(A), PCBA 110 includes a printed circuit board (PCB) 111 including a PCB handle section 112 at a rear end of PCB 111, and a PCB plug section 114 at a front end of PCB 111. PCB 111 is a substantially flat substrate, and has opposing sides that are referred to below as upper (first) surface 116 and lower (second) surface 118. Formed on upper surface 116 in plug section 114 are four of metal contacts 120. Metal contacts 120 are shaped and arranged in a pattern established by the USB specification. PCB 111 is formed in accordance with known PCB manufacturing techniques such that metal contacts 120, IC dies 130 and 135, and passive components 142, 144 and 146 are electrically interconnected by a predefined network including conductive traces 131 and 136 and other conducting structures that are sandwiched between multiple layers of an insulating material (e.g., FR4) and adhesive.

According to an aspect of the invention, passive components are mounted onto lower surface 118 using one or more standard surface mount technology (SMT) techniques, and one or more integrated circuit (IC) die (e.g., control IC die 130 and flash memory die 135) are mounted using chip-on-board (COB) techniques. As indicated in FIG. 1(B), during the SMT process, the passive components, such as capacitors 142, oscillator 144 and a light emitting diode 146, are mounted onto contact pads (described below) disposed on lower surface 118, and are then secured to the contact pads using known solder reflow techniques. To facilitate the SMT process, each of the passive components is packaged in any of the multiple known (preferably lead-free) SMT packages (e.g., ball grid array (BGA) or thin small outline package (TSOP)). In contrast, IC dies 130 and 135 are unpackaged, semiconductor "chips" that are mounted onto surface 118 and electrically connected to corresponding contact pads using known COB techniques. For example, as indicated in FIG. 1(B), control IC die 130 is electrically connected to PCB 111 by way of wire bonds 160-1 that are formed using known techniques. Similarly, flash memory IC die 135 is electrically connected to PCB 111 by way of wire bonds 160-2. Passive components 142, 144, 146, IC dies 130 and 135 and metal contacts 120 are operably interconnected by way of metal traces 131 and 136 that are formed on and in PCB 111 using known techniques, a few of which being depicted in FIG. 1(A) in a simplified manner by short dashed lines.

Housing 150 comprises molded plastic arranged such that substantially all of the plastic used to form housing 150 is located below (i.e., on one side of) PCB 111. Housing 150 includes a peripheral surface 151 extending downward (i.e., perpendicular to PCB 111), and a lower surface 152 that extends parallel to PCB 111. For discussion purposes, the portion of peripheral surface 151 surrounding handle section 112 of PCB 111 is referred to below as handle surface section 151-1, and the section of peripheral surface 151 surrounding plug section 114 of PCB 111 is referred to below as plug surface section 151-2. Similarly, the portion of lower surface 152 covering handle section 112 of PCB 111 is referred to below as handle surface section 152-1, and the section of lower surface 152 covering plug section 114 of PCB 111 is referred to below as plug cover section 152-2.

Referring again to FIG. 1(A), a handle structure 102 of USB device 100 is defined by handle surface section 151-1, handle surface section 152-1, and the exposed upper surface 116 of PCB handle section 112. Similarly, a plug structure 105 of USB device 100 is defined by plug surface section 151-2, plug surface section 152-2, and the exposed upper surface 116 of PCB plug section 114.

Figure 2B:
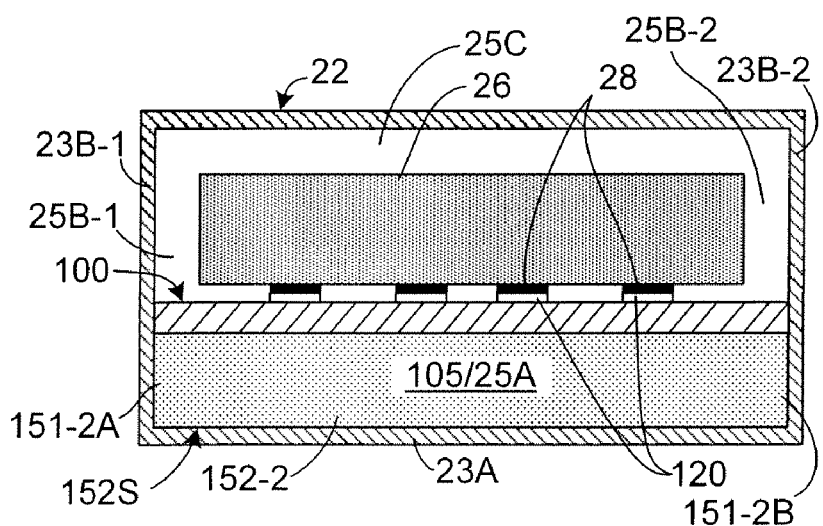

Referring to FIGS. 2(A) and 2(B), a thickness T1 and width W1 of plug structure 105 is selected to produce a secure (snug) fit inside standard female USB socket connector 22 (described above). Referring to FIG. 2(A), a height H between metal contacts 28 (i.e., a lower surface of connector substrate 26) and a lower wall 23A of the surrounding metal case is set by the USB standard at approximately 2.5 mm. Thickness T1 is set, for example, at 2.4 mm to assure a snug fit of plug structure 105 inside lower region 25A of female USB socket connector 22 (i.e., without significant vertical wobble) with metal contacts 120 in secure electrical contact with metal contacts 28 (as indicated in FIG. 2(B). Similarly, a width W between side walls 23B-1 and 23B-2 of the metal case is set by the USB standard at approximately 12.0 mm+/− 0.1 mm. Width W2 of plug structure 105 (i.e., between the outermost surfaces of side walls 151-2A and 151-2B) is set, for example, at 12 mm to further assure the snug fit of plug structure 105 inside lower region 25A of female USB socket connector 22. Note that plug structure 105 is referred to as "low-profile" and "half-height" herein in that plug structure 105 is only inserted into lower region 25A of female USB socket connector 22 (i.e., side regions 25B-1 and 25B-2 and upper region 25C, which are normally occupied by the metal case of a standard male USB plug connector, remain unoccupied by low-profile plug structure 105).

As indicated in FIG. 1(B), according to another aspect of the present invention, housing 150 includes a planar surface 152 that is parallel to PCB 111, and defines a single plane such that a first thickness T1 of plug structure 105 (i.e., measured between upper PCB surface 116 and planar surface 152 adjacent to metal contacts 120) is substantially equal to a second thickness T2 of handle section 102 (i.e., measured between upper PCB surface 116 and planar surface 152 adjacent to IC 135. That is, as indicated in FIG. 1(B), USB device 100 is substantially flat along its entire length (i.e., from rear edge 151-1A to front edge 151-1B). The term "substantially flat" is meant to indicate that planar surface 152 is substantially parallel to an uppermost surface of USB device 100 along its entire length. In the embodiment shown in FIGS. 1(A) and 1(B), the uppermost surface of USB device 100 is defined in part by upper surface 116 of PCB 111, which is parallel to planar surface 152 along the entire length of USB 100. Similarly, the term "substantially flat" is also intended to cover embodiments described below in which the housing includes a thin wall structure that is formed on or otherwise contacts the upper surface of the PCB. In these embodiments, the thickness T2 of handle structure 102 may differ by a small amount (e.g., 5% from thickness T1 of plug structure 105.

According to an aspect of the present invention, the "flatness" associated with USB device 100 is achieved by mounting all of the IC dies ("chips") and other electronic components of USB device 100 on lower surface 118 of PCB 111 (i.e., on the side opposite to metal contacts 120). That is, the minimum overall thickness of USB device 100 is determined by the thickness T1, which is required to maintain a snug connection between plug structure 105 and female USB socket connector 22 (as indicated in FIG. 2(B)). Because this arrangement requires that metal contacts 120 be located at the uppermost surface, and that plug wall section 151-2 plug and cover section 152-2 extend a predetermined distance below PCB 111 to provide the required thickness T1. Thus, the overall thickness of USB device 100 can be minimized by mounting the IC dies 130 and 135 and passive components (e.g., capacitor 142) only on lower surface 118 of PCB 111. That is, if the IC dies and passive components are mounted on upper surface 116, then the overall thickness of the resulting USB structure would be the required thickness T1 plus the thickness that the ICs extend above PCB 111 (plus the thickness of a protective wall, if used).

According to another aspect associated with the embodiment shown in FIGS. 1(A) and 1(B), upper surface 116 of PCB 111 is entirely exposed on the upper surface of USB device 100, thus facilitating the production of USB 100 with a maximum thickness equal to thickness T1 of plug structure 105. That is, because metal contacts 120 are formed on upper surface 116, and upper surface 116 defines the higher end of required plug structure thickness T1, the overall height of USB device 100 can be minimized by exposing upper surface 116 (i.e., by making any point on upper PCB surface 116 the uppermost point of USB device 100). As indicated in FIG. 1(A), in accordance with feature specifically associated with USB device 100, peripheral wall 151 extends around and covers the peripheral side edges of PCB 111, and an upper edge of peripheral wall 151 is coplanar with upper surface 116 of PCB 111. By covering the peripheral side edge of PCB 111, peripheral wall 151 prevents objects from wedging between PCB 111 and housing 150, thereby preventing undesirable separation of PCBA 110 from housing 150.

Figure 3:
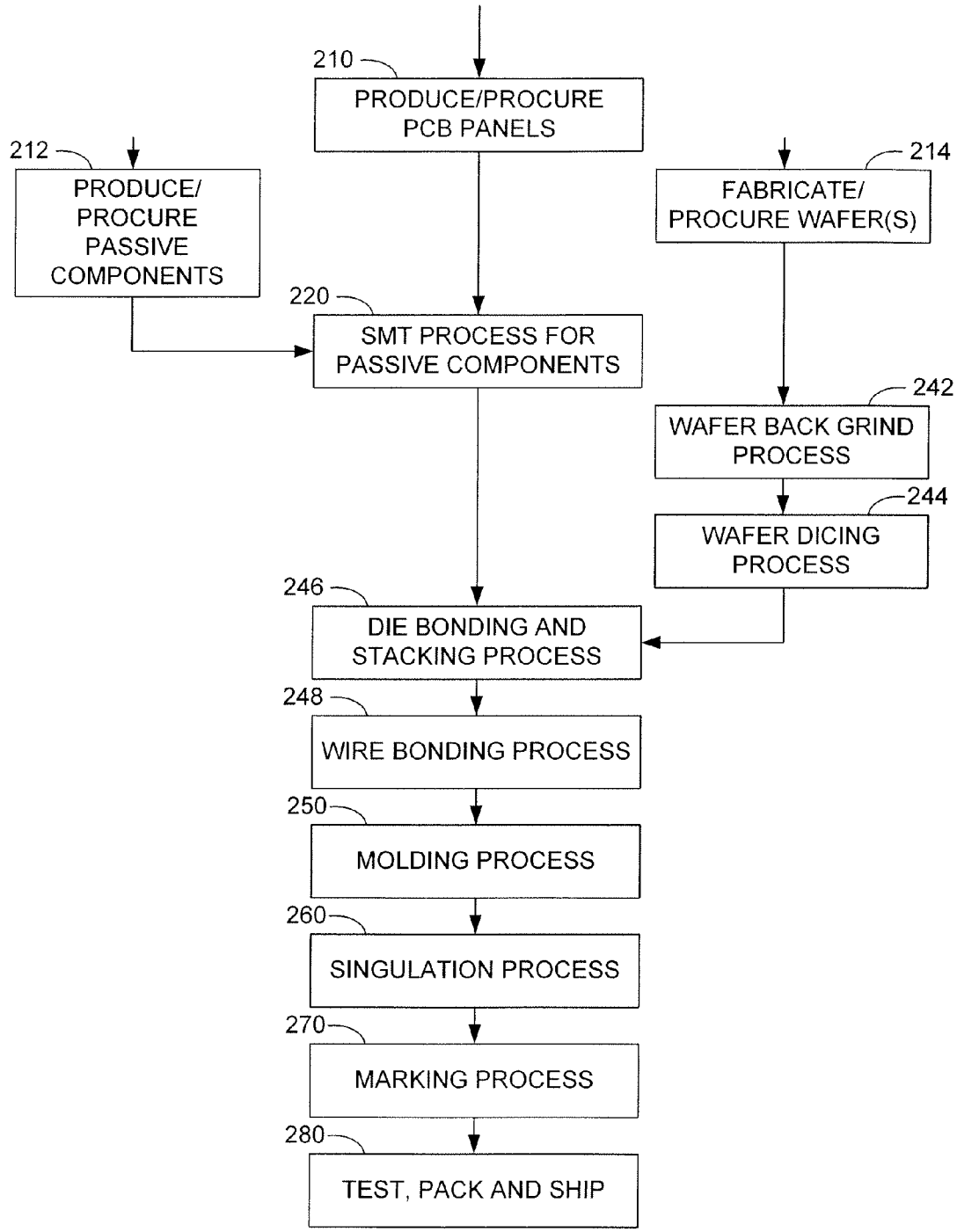
FIG. 3 is a flow diagram showing a method for producing the USB device of FIGS. 1(A) and 1(B) according to another embodiment of the present invention.

FIG. 3 is a flow diagram showing a method for producing USB device 100 according to another embodiment of the present invention. Summarizing the novel method, a PCB panel is generated using known techniques (block 210), passive components are mounted on the PCB panel using SMT techniques (block 225), and the IC dies are die bonded (block 236) and wire bonded (block 238) using known COB techniques. Molten plastic is then used to form a molded housing over the passive components and the IC dies (block 240). Then PCB panel is then singulated (cut) in to separate USB devices (block 250), the individual USB devices are marked (block 260), and then the USB devices are tested, packed and shipped (block 270) according to customary practices. This method, provides several advantages over conventional manufacturing methods that utilize SMT techniques only. First, by utilizing COB techniques to mount the USB controller and flash memory, the large amount of space typically taken up by these devices is dramatically reduced, thereby facilitating significant miniaturization of the resulting USB device footprint. Second, by implementing the wafer grinding methods described below, the die height is greatly reduced, thereby facilitating stacked memory arrangements such as those described below with reference to FIG. 18. The molded housing also provides greater moisture and water resistance and higher impact force resistance than that achieved using conventional manufacturing methods. In comparison to the standard USB memory card manufacturing that used SMT process, it is cheaper to use the combined COB and SMT (plus molding) processes described herein because, in the SMT-only manufacturing process, the bill of materials such as Flash memory and the Controller chip are also manufactured by COB process, so all the COB costs are already factored into the packaged memory chip and controller chip. Therefore, the combined COB and SMT method according to the present invention provides a less expensive and higher quality (i.e., more reliable) memory product with a smaller size than that possible using conventional SMT-only manufacturing methods.

The flow diagram of FIG. 3 will now be described in additional detail below with reference to FIGS. 4(A) to 17(B).

Referring to the upper portion of FIG. 3, the manufacturing method begins with filling a bill of materials including producing/procuring PCB panels (block 210), producing/procuring passive (discrete) components (block 212) such as resistors, capacitors, diodes, LEDs and oscillators that are packaged for SMT processing, and producing/procuring a supply of IC wafers (or individual IC dies).

Figure 4A:
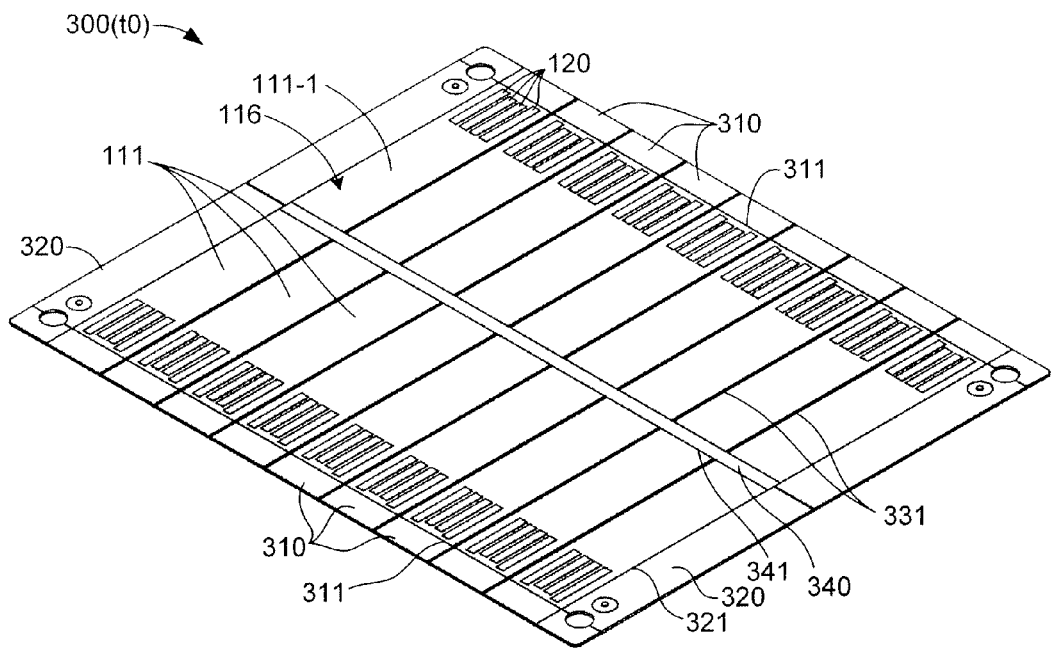
FIGS. 4(A) and 4(B) are bottom and top perspective views showing a PCB panel utilized in the method of FIG. 3.
Figure 4B:
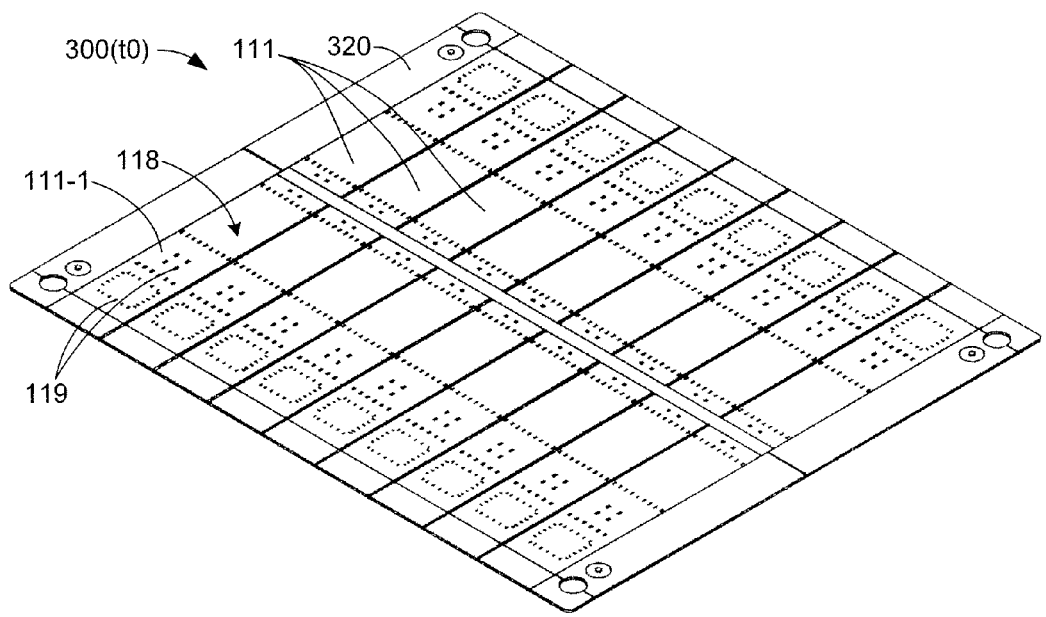

FIGS. 4(A) and 4(B) are top and bottom perspective views, respectively, showing a PCB panel 300(t0) provided in block 210 of FIG. 3 according to a specific embodiment of the present invention. The suffix "tx" is utilized herein to designated the state of the PCB panel during the manufacturing process, with "t0" designating an initial state. Sequentially higher numbered prefixes (e.g., "t1", "t2" and "t3") indicate that PCB panel 300 has undergone additional processing.

As indicated in FIGS. 4(A) and 4(B), PCB panel 300(t0) includes a two-by-nine matrix of regions designated as PCBs 111, each having the features described above with reference to FIGS. 1(A) and 1(B). FIG. 4(A) shows upper surface 116 of each PCB 111 (e.g., upper surface 116 of panel 111-1 includes metal contacts 120), and FIG. 4(B) shows lower surface 118 of each PCB 111. Note that lower surface 118 of each PCB 111 (e.g., PCB 111-1) includes multiple contact pads 119 arranged in predetermined patterns for facilitating SMT and COB processes, as described below.

As indicated in FIG. 4(A), in addition to the two rows of PCBs 111, panel 300(t0) includes end border regions 310 and side border regions 320 that surround the PCBs 111, and a central region 340 disposed between the two rows of PCBs 111. Designated cut lines are scored or otherwise partially cut into PCB panel 300(t0) along the borders of each of these regions, but do not pass through the panel material. For example, end cut lines 311 separate end border panels 310 from associated PCBs 111, side cut lines 321 separate side border panels 310 from associated PCBs 111, and central cut lines 341 separate central region 340 from associated PCBs 111. PCB cut lines 331 are formed along the side edges between adjacent PCBs 111. The border panels are provided with positioning holes and other features known to those skilled in the art to facilitate the manufacturing process, and are removed during singulation (described below).

Note that PCBs for USB devices that are produced using SMT-only manufacturing processes must be significantly wider than PCBs 111 due to the space required to mount already packaged flash memory devices. As such, PCB panels for SMT-only manufacturing methods typically include only twelve PCBs arranged in a 2×6 matrix. By utilizing COB methods to mount the flash memory, the present invention facilitates significantly narrower PCB 111, thereby allowing each PCB panel 300(t0) to include 18 PCBs 111 arranged in a 2×9 matrix. By increasing the number of PCBs 111 per PCB panel, the present invention provides shorter manufacturing time and hence lower cost.

Figure 5:
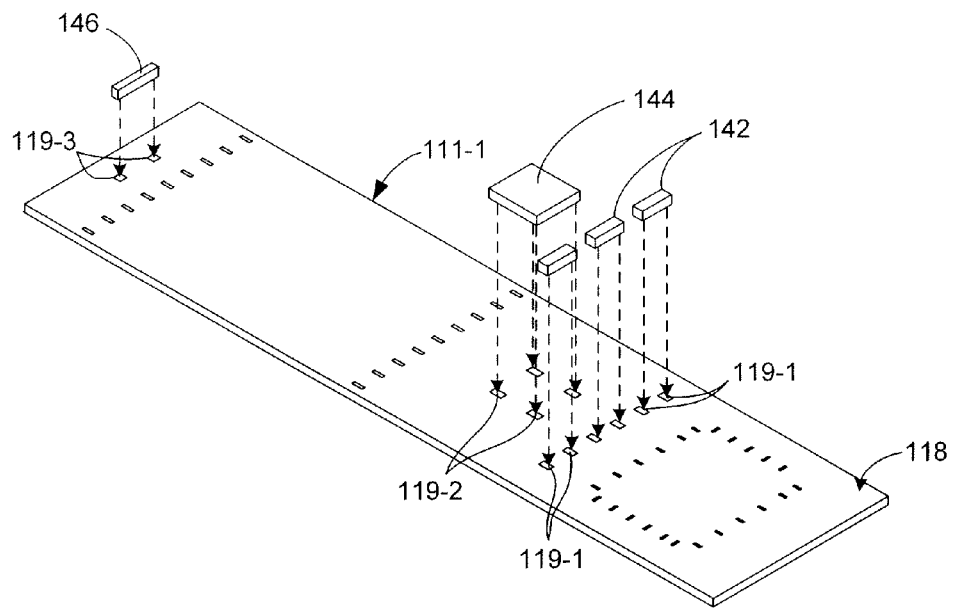
FIG. 5 is a perspective view depicting a surface mount technology (SMT) process for mounting passive components on a PCB according to the method of FIG. 3.
Figure 6:
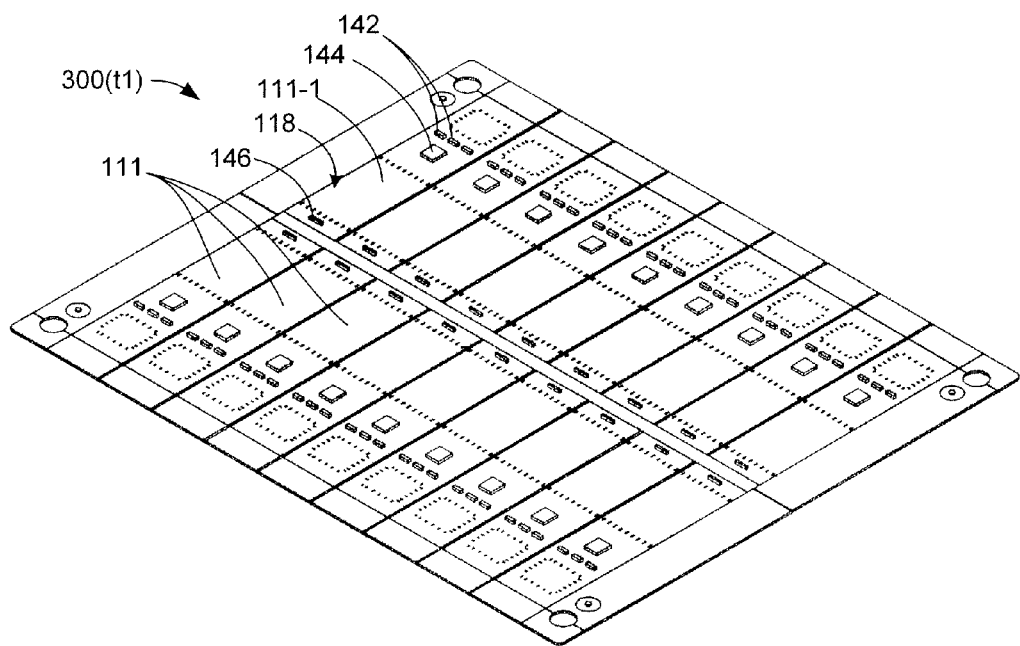
FIG. 6 is a top perspective views showing the PCB panel of FIG. 4(B) after the SMT process is completed.

FIG. 5 is a perspective view depicting a portion of a SMT process that is used to mount passive components on PCB 111-1 according to block 220 of FIG. 3. During the first stage of the SMT process, lead-free solder paste is printed on contact pads 119-1, 119-2 and 119-3, which in the present example correspond to SMT components 142, 144 and 146, using custom made stencil that is tailored to the design and layout of PCB 111-1. After dispensing the solder paste, the panel is conveyed to a conventional pick-and-place machine that mounts SMT components 142, 144 and 146 onto contact pads 119-1, 119-2 and 119-3, respectively, according to known techniques. Upon completion of the pick-and-place component mounting process, the PCB panel is then passed through an IR-reflow oven set at the correct temperature profile. The solder of each pad on the PC board is fully melted during the peak temperature zone of the oven, and this melted solder connects all pins of the passive components to the finger pads of the PC board. FIG. 6 shows the resulting sub-assembled PCB panel 300(t1), in which each PCB 111 (e.g., PCB 111-1) includes passive components 142, 144 and 146 mounted thereon by the completed SMT process.

Figure 7:
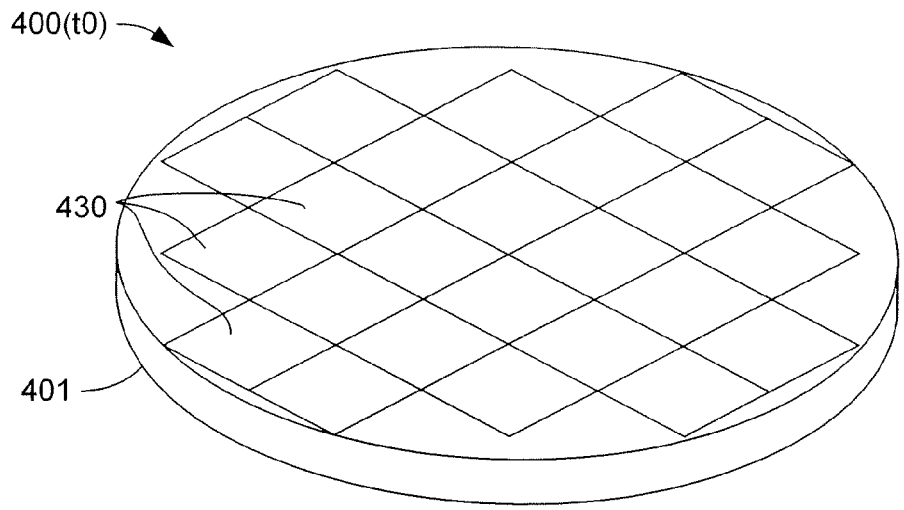
FIG. 7 is a simplified perspective view showing a semiconductor wafer including integrated circuits (ICs) utilized in the method of FIG. 3.

FIG. 7 is a simplified perspective view showing a semiconductor wafer 400(t0) procured or fabricated according to block 214 of FIG. 3. Wafer 400(t0) includes multiple ICs 430 that are formed in accordance with known photolithographic fabrication (e.g., CMOS) techniques on a semiconductor base

401. In the example described below, wafer 400(t1) includes ICs 430 that comprise USB controller circuits. In a related procedure, a wafer (not shown) similar to wafer 400(t1) is produced/procured that includes flash memory circuits, and in an alternative embodiment (described in additional detail below), ICs 430 may include both USB controller circuits and flash memory circuits. In each instance, these wafers are processed as described herein with reference to FIGS. 8(A), 8(B) and 8(C).

Figure 8A:
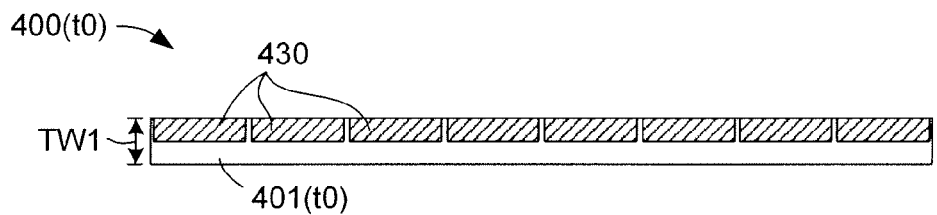
FIGS. 8(A), 8(B) and 8(C) are simplified cross-sectional side views depicting a process of grinding and dicing the wafer of FIG. 7 to produce IC dies.
Figure 8B:
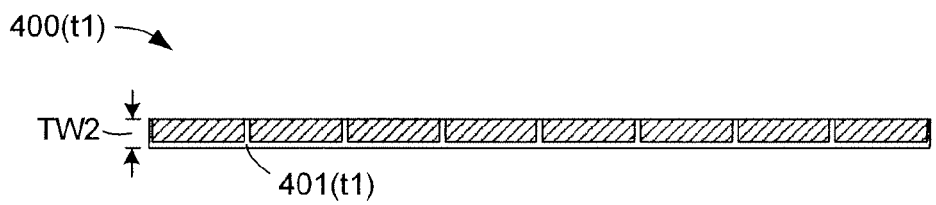

As indicated in FIGS. 8(A) and 8(B), during a wafer back grind process according to block 242 of FIG. 3, base 401 is subjected to a grinding process in order to reduce the overall initial thickness TW1 of each IC 430. Wafer 400(t1) is first mount face down on sticky tape (i.e., such that base layer 401(t0) faces away from the tape), which is pre-taped on a metal or plastic ring frame (not shown). The ring-frame/wafer assembly is then loaded onto a vacuum chuck (not shown) having a very level, flat surface, and has diameter larger than that of wafer 400(t0). The base layer is then subjected to grinding until, as indicated in FIG. 8(B), wafer 400(t1) has a pre-programmed thickness TW2 that is less than initial thickness TW1 (shown in FIG. 8(A)). The wafer is cleaned using de-ionized (DI) water during the process, and wafer 400(t1) is subjected to a flush clean with more DI water at the end of mechanical grinding process, followed by spinning at high speed to air dry wafer 400(t1).

Figure 8C:
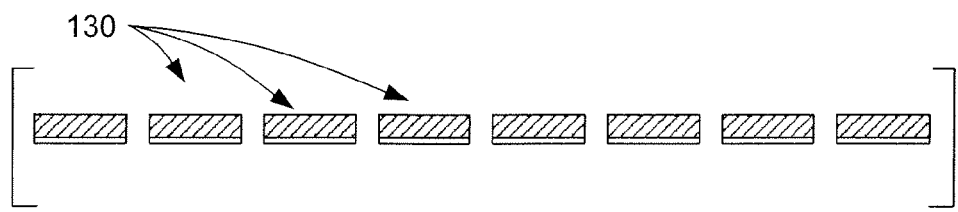

Next, as shown in FIG. 8(C), the wafer is diced (cut apart) along predefined border regions separating ICs 420 in order to produce IC dies 130 according to block 244 of FIG. 3. After the back grind process has completed, the sticky tape at the front side of wafer 400(t1) is removed, and wafer 400(t1) is mounted onto another ring frame having sticky tape provided thereon, this time with the backside of the newly grinded wafer contacting the tape. The ring framed wafers are then loaded into a die saw machine. The die saw machine is pre-programmed with the correct die size information, X-axis and Y-axis scribe lanes' width, wafer thickness and intended over cut depth. A proper saw blade width is then selected based on the widths of the XY scribe lanes. The cutting process begins dicing the first lane of the X-axis of the wafer. De-ionized wafer is flushing at the proper angle and pressure around the blade and wafer contact point to wash and sweep away the silicon saw dust while the saw is spinning and moving along the scribe lane. The sawing process will index to the second lane according to the die size and scribe width distance. After all the X-axis lanes have been completed sawing, the wafer chuck with rotate 90 degree to align the Y-axis scribe lanes to be cut. The cutting motion repeated until all the scribe lanes on the Y-axis have been completed.

Figure 9:
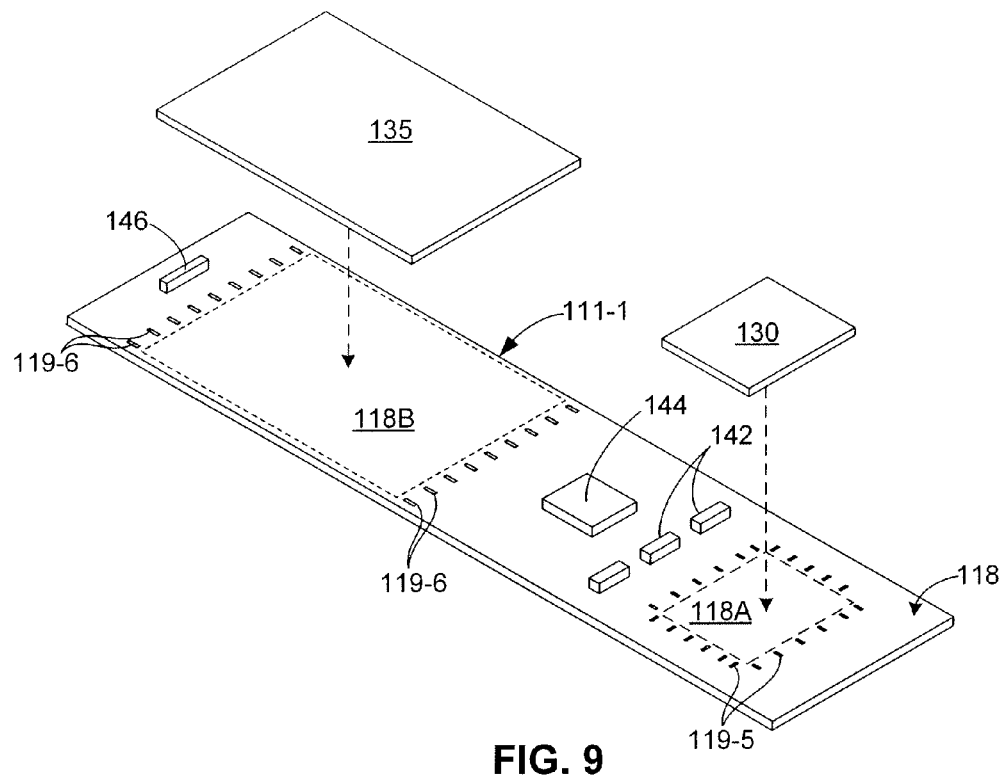
FIG. 9 is a perspective view depicting a die bonding process utilized to mount the IC dies of FIG. 8(C) on a PCB according to the method of FIG. 3.
Figure 10:
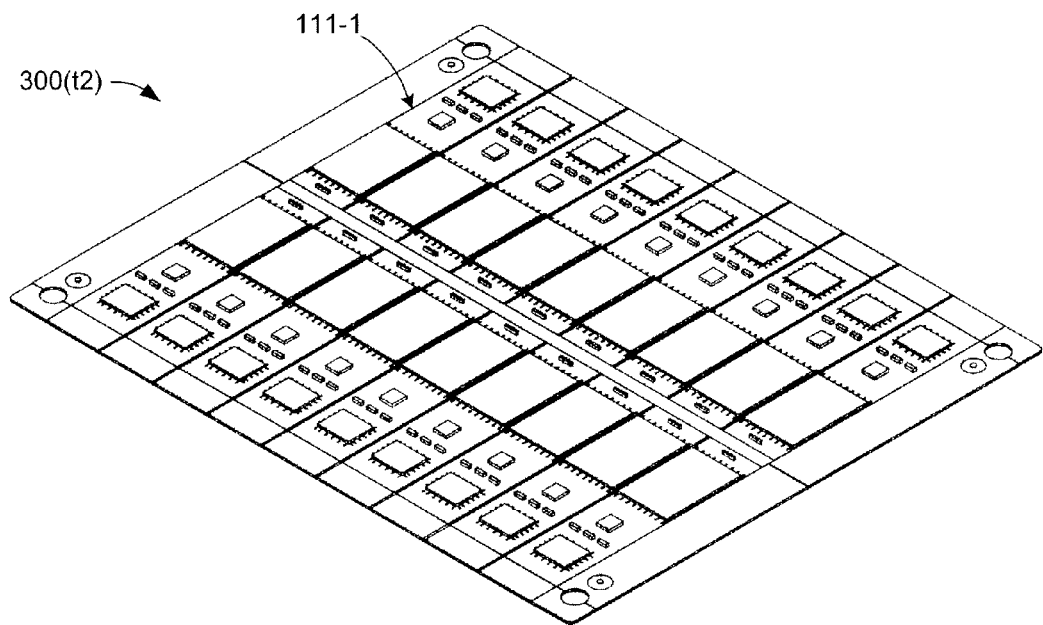
FIG. 10 is a top perspective views showing the PCB panel of FIG. 4(B) after the die bonding process is completed.

FIG. 9 is a perspective view depicting a die bonding process utilized to mount the controller IC dies 130 of FIG. 8(C) and flash memory IC dies 135 on PCB 111-1 of the PCB panel according to block 246 of FIG. 3. The die bonding process is performed on PCB panel 300(t1) (see FIG. 6), that is, after completion of the SMT process. The die bonding process generally involves mounting controller IC dies 130 into lower surface region 118A, which is surrounded by contact pads 119-5, and mounting flash IC dies 135 into lower surface region 118B, which is disposed between rows of contact pads 119-6. In one specific embodiment, an operator loads IC dies 130 and 135 onto a die bonder machine according to known techniques. The operator also loads multiple PCB panels 300(t1) onto the magazine rack of the die bonder machine. The die bonder machine picks the first PCB panel 300(t1) from the bottom stack of the magazine and transports the selected PCB panel from the conveyor track to the die bond (DB) epoxy dispensing target area. The magazine lowers a notch automatically to get ready for the machine to pick up the second piece (the new bottom piece) in the next cycle of die bond operation. At the die bond epoxy dispensing target area, the machine automatically dispenses DB epoxy, using pre-programmed write pattern and speed with the correct nozzle size, onto the target areas 118A and 118B of each of the PCB 111 of PCB panel 300(t1). When all PCBs 111 have completed this epoxy dispensing process, the PCB panel is conveyed to a die bond (DB) target area. Meanwhile, at the input stage, the magazine is loading a second PCB panel to this vacant DB epoxy dispensing target area. At the die bond target area, the pick up arm mechanism and collet (suction head with rectangular ring at the perimeter so that vacuum from the center can create a suction force) picks up an IC die 130 and bonds it onto area 118A, where epoxy has already dispensed for the bonding purpose, and this process is then performed to place IC die 135 into region 118B. Once all the PCB boards 111 on the PCB panel have completed die bonding process, the PCB panel is then conveyed to a snap cure region, where the PCB panel passes through a chamber having a heating element that radiates heat having a temperature that is suitable to thermally cure the epoxy. After curing, the PCB panel is conveyed into the empty slot of the magazine waiting at the output rack of the die bonding machine. The magazine moves up one slot after receiving a new panel to get ready for accepting the next panel in the second cycle of process. The die bonding machine will repeat these steps until all of the PCB panels in the input magazine are processed. This process step may repeat again for the same panel for stack die products that may require to stacks more than one layer of memory die. FIG. 10 is a top perspective views showing PCB panel 300(t2) after the die bonding process is completed.

Figure 11:
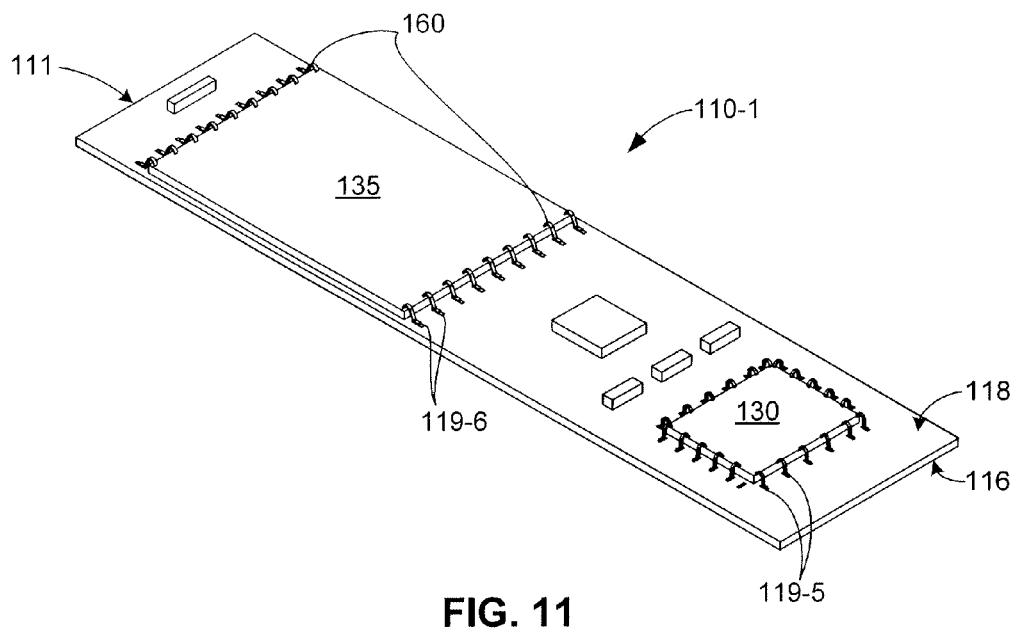
FIG. 11 is a perspective view depicting a wire bonding process utilized to connect the IC dies of FIG. 8(C) to corresponding contact pads disposed on a PCB according to the method of FIG. 3.
Figure 12:
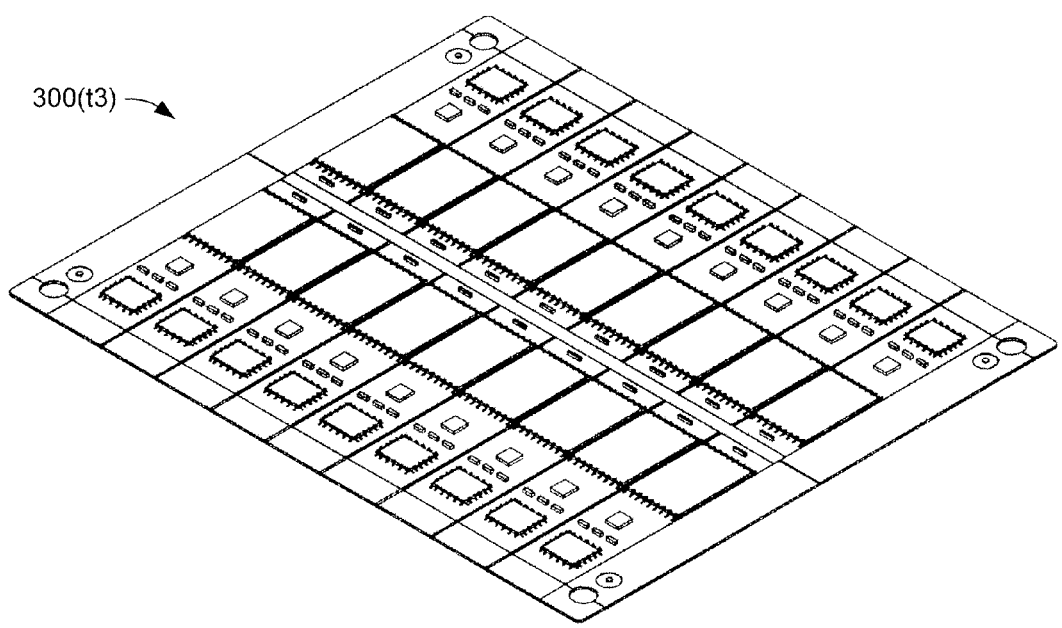
FIG. 12 is a top perspective views showing the PCB panel of FIG. 4(B) after the wire bonding process is completed.

FIG. 11 is a perspective view depicting a wire bonding process utilized to connect the IC dies 130 and 135 to corresponding contact pads 119-5 and 119-6, respectively, according to block 248 of FIG. 3. The wire bonding process proceeds as follows. Once a full magazine of PCB panels 300(t2) (see FIG. 10) has completed the die bonding operation, an operator transports the PCB panels 300(t2) to a nearby wire bonder (WB) machine, and loads the PCB panels 300(t2) onto the magazine input rack of the WB machine. The WB machine is pre-prepared with the correct program to process this specific USB device. The coordinates of all the ICs' pads 119-5 and 119-6 and PCB gold fingers were previously determined and programmed on the WB machine. After the PCB panel with the attached dies is loaded at the WB bonding area, the operator commands the WB machine to use optical vision to recognize the location of the first wire bond pin of the first memory die of the first PCB on the panel. Once the first pin is set correctly, the WB machine can carry out the whole wire bonding process for the rest of the panels of the same product type automatically. For multiple flash layer stack dies, the PCB panels may be returned to the WB machine to repeat wire bonding process for the second stack. FIG. 12 is a top perspective views showing PCB panel 300(t3) after the wire bonding process is completed.

Figure 13A:
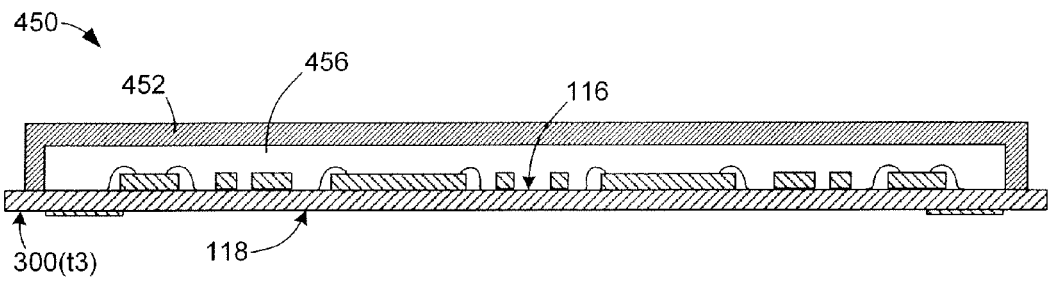
FIGS. 13(A) and 13(B) are simplified cross-sectional side views depicting a molding process for forming a molded housing over the PCB panel of FIG. 4(B) according to the method of FIG. 3.
Figure 13B:
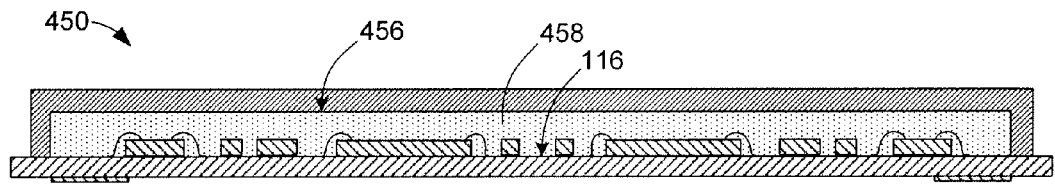
Figure 14:
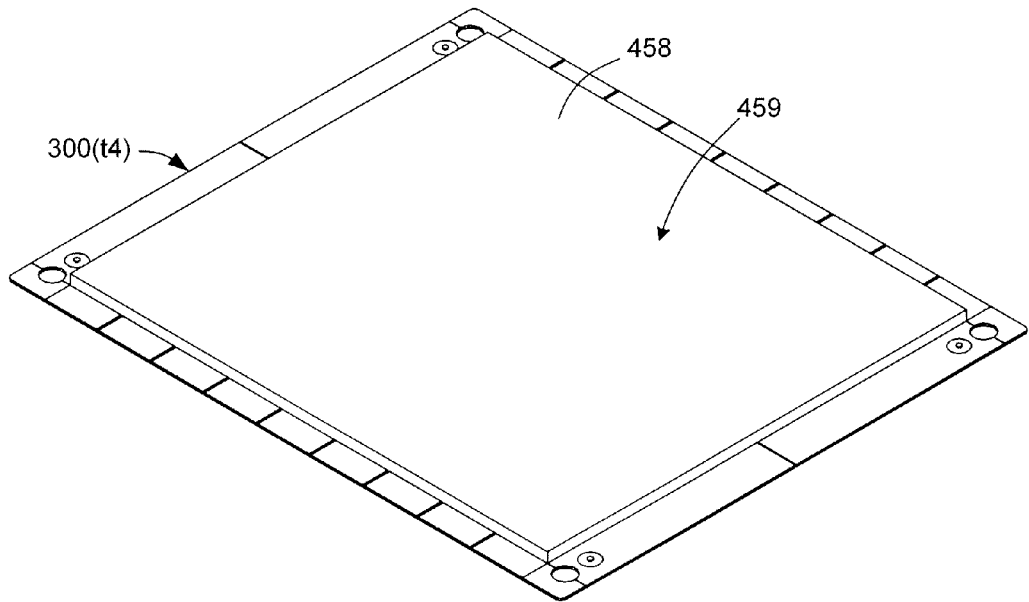
FIG. 14 is a top perspective views showing the PCB panel of FIG. 4(B) after the molding process is completed.

FIGS. 13(A) and 13(B) are simplified cross-sectional side views depicting a molding process for forming a molded housing layer over PCB panel 300(t3) according to block 250 of FIG. 3. As indicated in FIG. 13(A), after the wire bonding process is completed, USB panel 300(t3) is loaded into a mold machine 450 including a cover plate 452 that mounts onto lower surface 116 of PCB panel 300(t3), and defines a chamber 456 that is disposed over the IC chips, wire bonds and passive components that are mounted on lower surface 116. Note that no molding material is applied to upper surface 118. Transfer molding is prefer here due to the high accuracy of transfer molding tooling and low cycle time. The molding material in the form of pellet is preheated and loaded into a pot or chamber (not shown). As depicted in FIG. 13(B), a plunger (not shown) is then used to force the material from the pot through channels known as a spruce and runner system into the mold cavity 456, causing the molten (e.g., plastic) material to form a molding layer 458 that encapsulates all the IC chips and components, and to cover all the exposed areas of lower surface 116. The mold remains closed as the material is inserted and filled up all vacant in cavity 456. During the process, the walls of cover plate 452 are heated to a temperature above the melting point of the mold material, which facilitates a faster flow of material through cavity 456. Mold machine 450 remains closed until a curing reaction within the molding material is complete. A cooling down cycle follows the injection process, and the molding materials of molding layer 458 start to solidify and harden. Ejector pins push PCB panel 300(t4) (shown in FIG. 14) from the mold machine once molding layer 458 has hardened sufficiently. As depicted in FIG. 14, molding layer 458 forms a uniform block with a flat, smooth upper surface 459 on PCB panel 300(t4).

Figure 15:
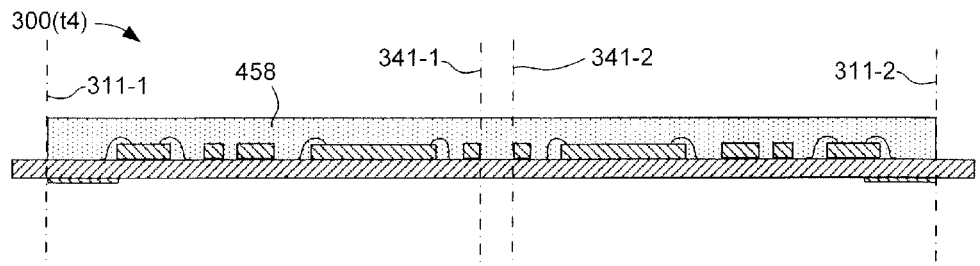
FIG. 15 is simplified cross-sectional side view depicting a singulation process for separating the PCB panel of FIG. 4(B) into individual USB devices according to the method of FIG. 3.
Figure 16A:
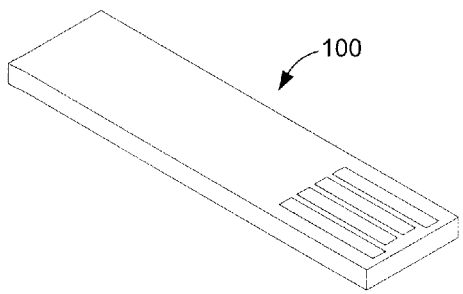
FIGS. 16(A) and 16(B) are bottom and top perspective views showing USB devices after the singulation process of FIG. 3 is completed.
Figure 16B:
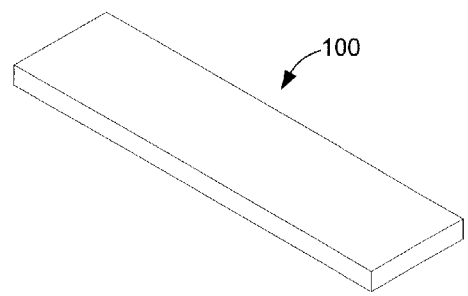

FIG. 15 is simplified cross-sectional side view depicting a singulation process according to block 260 of FIG. 3 that is used to separate PCB panel 300(t4) into individual USE devices. PCB panel 300(t4) is loaded into a saw machine (not shown) that is pre-programmed with a singulation routine that includes predetermined cut locations. The saw blade is aligned to the first cut line (e.g., end cut line 311-1) as a starting point by the operator. The coordinates of the first position are stored in the memory of the saw machine. The saw machine then automatically proceeds to cut up (singulate) the USB pane 300(t4), for example, successively along cut lines 311-1, 341-1, 341-2, and 311-2, and then along the side cut lines and PCB cut lines (see FIG. 4(A)) to form individual USB devices according to the pre-programmed singulation routine. FIGS. 16(A) and 16(B) are top and bottom perspective views showing a USE device 100 after the singulation process is completed.

Figure 17A:
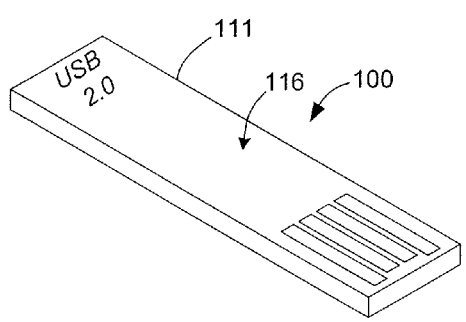
FIGS. 17(A) and 17(B) are bottom and top perspective views showing the USB device of FIG. 16(A) after a marking process is performed in accordance with the method of FIG. 3.
Figure 17B:
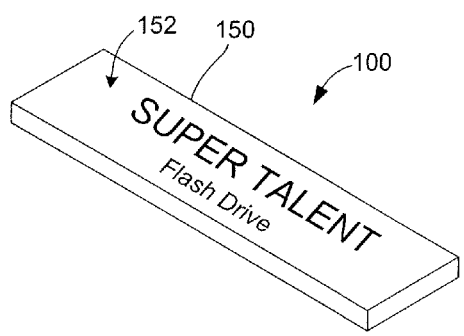

FIGS. 17(A) and 17(B) are top and bottom perspective views showing a singulated USB device 100 after a marking process is performed in accordance with block 270 of the method of FIG. 3. The singulated and completed USB devices 100 undergo a marking process in which a designated company's logo, USB logo, RoHs logo, speed value, density value, or other related information are printed on surface 152 of housing 150 and/or upper surface 116 of PCB 111. After marking, USB devices 100 are placed in the baking oven to cure the permanent ink.

Referring to block 280 located at the bottom of FIG. 3, a final procedure in the manufacturing method of the present invention involves testing, packing and shipping the individual USB devices. The marked USB devices 100 shown in FIGS. 17(A) and 17(B) are then subjected to visual inspection and electrical tests consistent with well established techniques. Visually or/and electrically test rejects are removed from the good population as defective rejects. The good memory cards are then packed into custom made boxes which are specified by customers. The final packed products will ship out to customers following correct procedures with necessary documents.

As suggested in the above example, in addition to reducing overall manufacturing costs by utilizing unpackaged controller and flash memory dies (i.e., by eliminating the packaging costs associated with SMT-ready controller and flash memory devices), the present invention provides a further benefit of facilitating greatly expanded memory capacity without increasing the overall size of USB device 100. For example, FIG. 18 is simplified cross-sectional side view showing a stacked-memory USB device 500 in which a first flash memory chip 535-1 is mounted on a lower surface 518 and connected by first wire bonds 560-1 to PCB 511 in the manner described above. Because the IC die height (thickness) D is much smaller than packaged flash memory devices, and because the thickness T1 of USB device 500 is set, for example, at 2.0 mm to assure a snug fit of plug structure 105 inside lower region 25A of female USB socket connector 22 (as discussed above with reference to FIG. 2(B), the present invention facilitates a stacked memory arrangement in which a second flash memory die 535-2 is mounted on first flash memory die 535-1 and connected to PCB 511 by way of second wire bonds 560-2. In an alternative embodiment (not shown), second flash memory die 535-2 may be connected to contacts provided on first flash memory die 535-1 by associated wire bonds. This stacked memory arrangement greatly increases memory capacity of the USB devices without increasing the footprint (i.e., thickness T1, length and width) of low-profile USB device 500.

Figure 20:
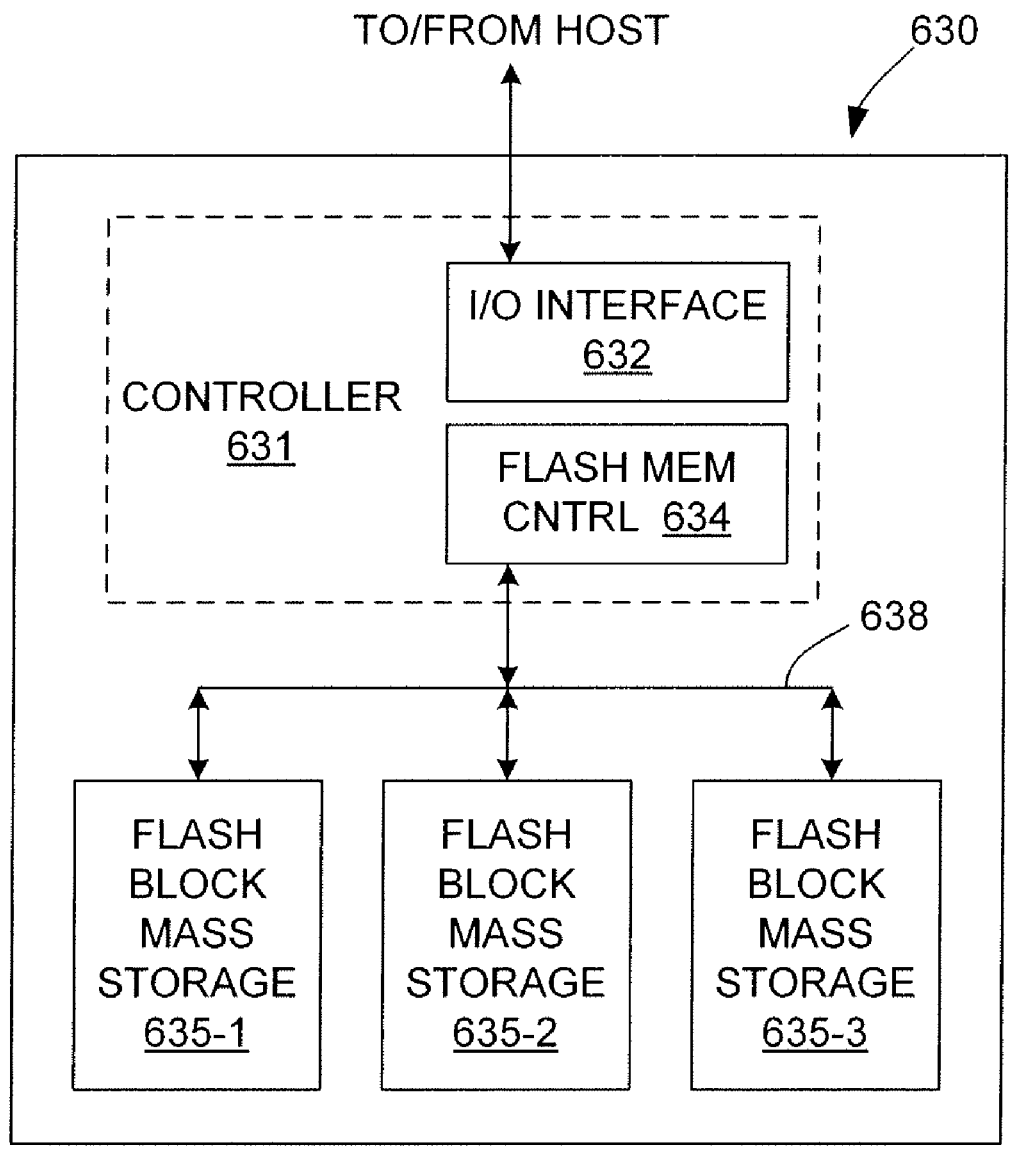
FIG. 20 is a block diagram showing a flash microcontroller integrated circuit die with flash mass storage blocks.

FIG. 19 is simplified cross-sectional side view showing a low-profile USB device 600 including stacked-memory according to another embodiment of the present invention. Low-profile USB device 600 is distinguished over the previous embodiments in that, instead of separate USB controller and flash memory chips, USB device 600 utilizes a single-chip controller/flash die 630 that is connected to a PCB 611 by way of wire bonds 660 in the manner described above, and is characterized in that, as shown in FIG. 20, single-chip controller/flash die 630 includes both a controller circuit 631 and one or more flash block mass storage circuits 635-1 to 635-3 that are interconnected by a bus 638. Controller circuit 631 includes an input/output (I/O) interface circuit 632 that facilitates sending and receiving commands and data to/from a host (not shown) into which USB device 600 is plugged. Controller circuit 631 also includes a flash-memory controller 634 that facilitates sending and receiving sends data over one or more internal flash buses 638 to/from flash mass storage blocks 635-1, 635-2, 635-3. Because internal flash bus 638 is internal to single-chip controller/flash die 630, external pins are not required for the interface to flash memory blocks 635-1, 635-2, 635-3. In one embodiment, flash mass storage blocks 635-1, 635-2, 635-3 are not randomly accessible. Instead, a command and an address are transferred as data over internal flash bus 638 to indicate a block of data to transfer from flash mass storage blocks 635-1, 635-2, 635-3. Thus, flash mass storage blocks 635-1, 635-2, 635-3 are block-addressable mass storage, rather than random-access memory (RAM). In another embodiment, flash mass storage blocks 635-1, 635-2, 635-3 are aggregated together by the flash microcontroller of controller circuit 631 631, which maps and directs data transactions to selected flash storage blocks 635-1, 635-2, 635-3. Because the flash microcontroller 631 performs memory management, flash storage blocks 635-1, 635-2, 635-3 appear as a single, contiguous memory to external hosts. Additional details regarding the use of single-chip controller/flash die 630 is provided in co-owned U.S. Pat. No. 7,103,684, which is incorporated herein by reference in its entirety.

In addition to being used as a stand-alone USB device, the short, low-profile USB devices described in the embodiments above may be utilized as modular units that are incorporated into USB assemblies. Two examples of such USB assemblies are described in the following paragraphs.

Figure 21:
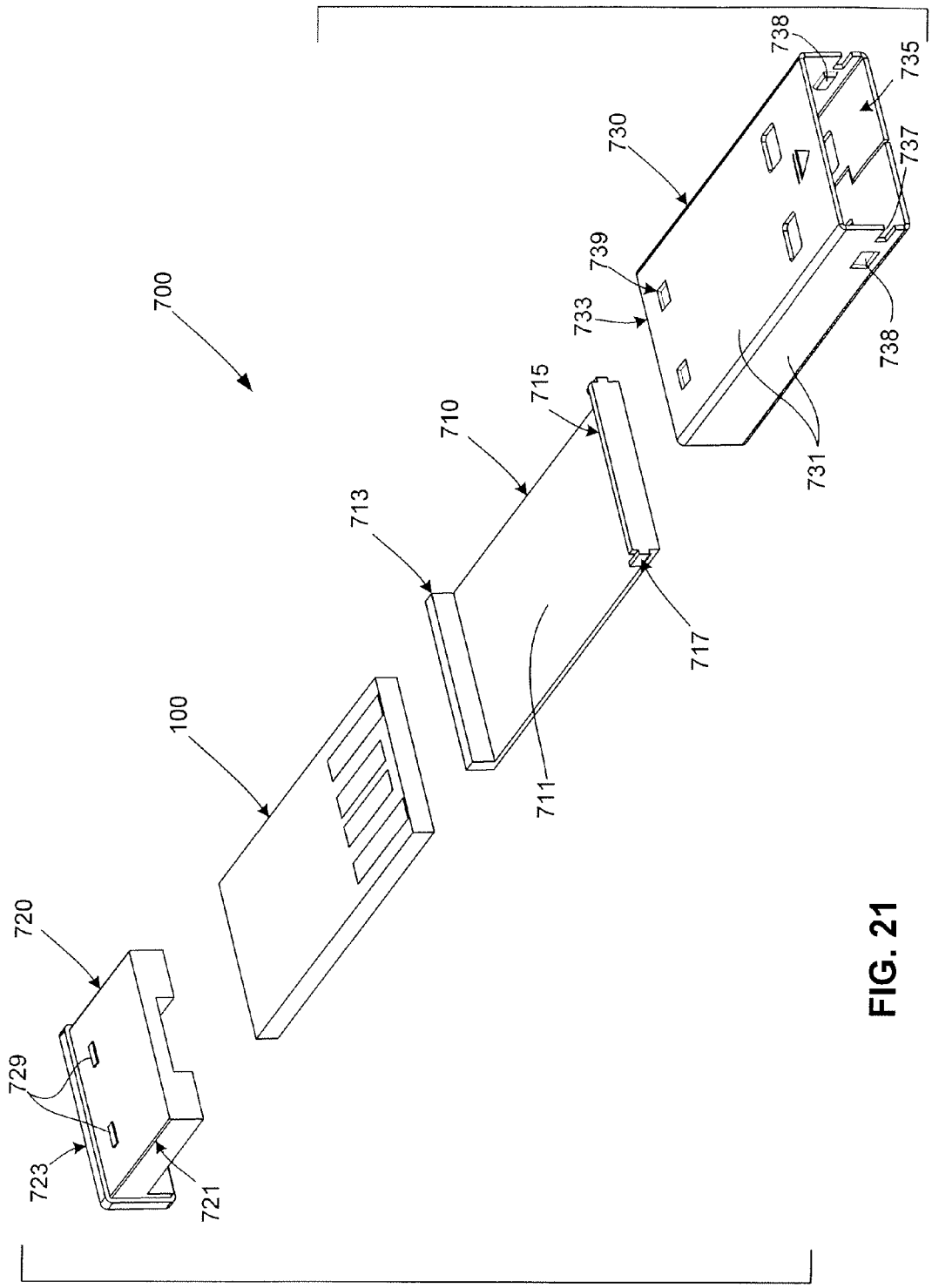
FIG. 21 is an exploded perspective view showing a USB assembly with a full metal case according to another embodiment of the present invention.
Figure 22A:
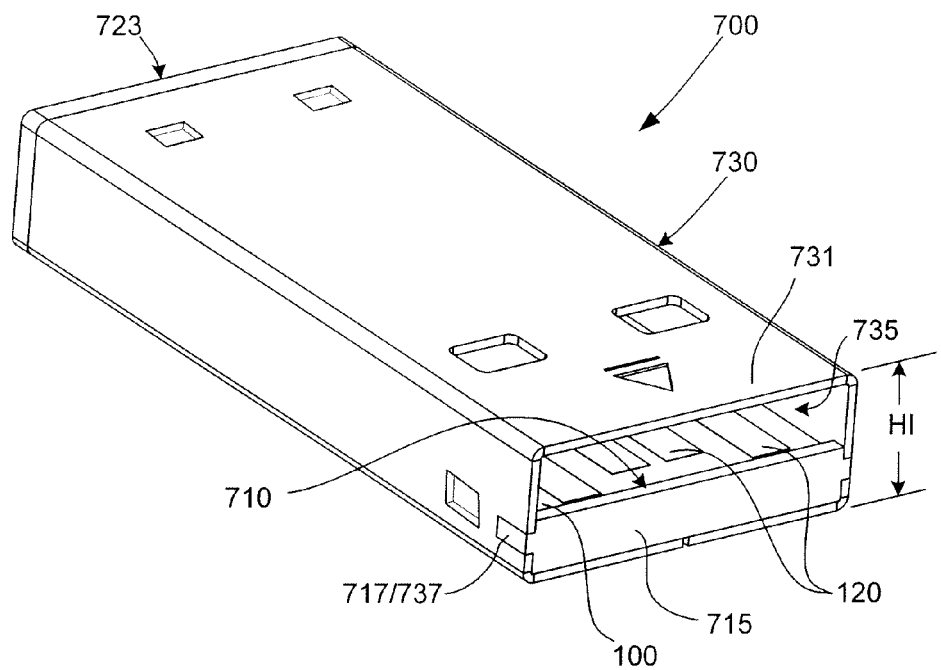
FIGS. 22(A) and 22(B) are front perspective and rear perspective views showing the USB assembly of FIG. 21 in an assembled state.
Figure 22B:
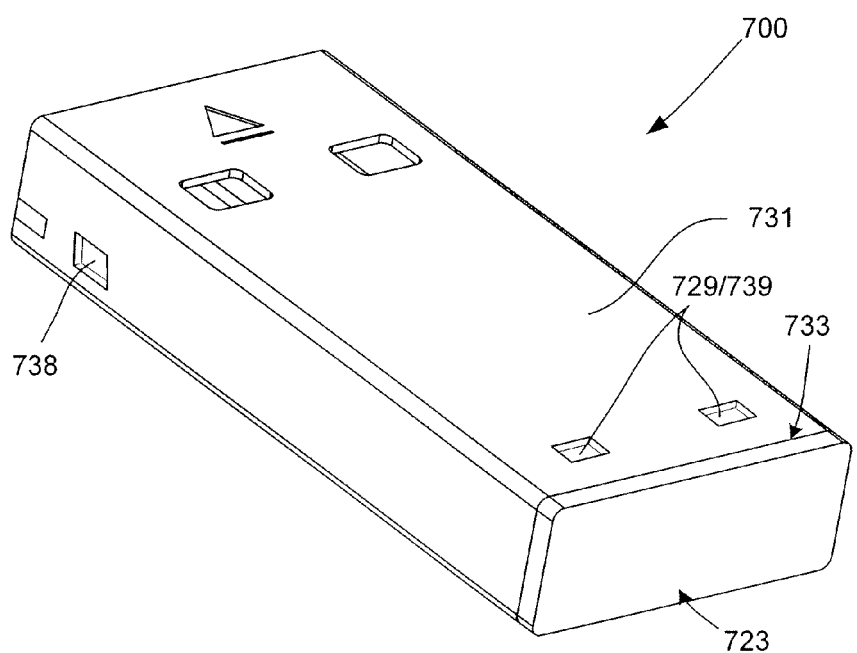
Figure 24A:
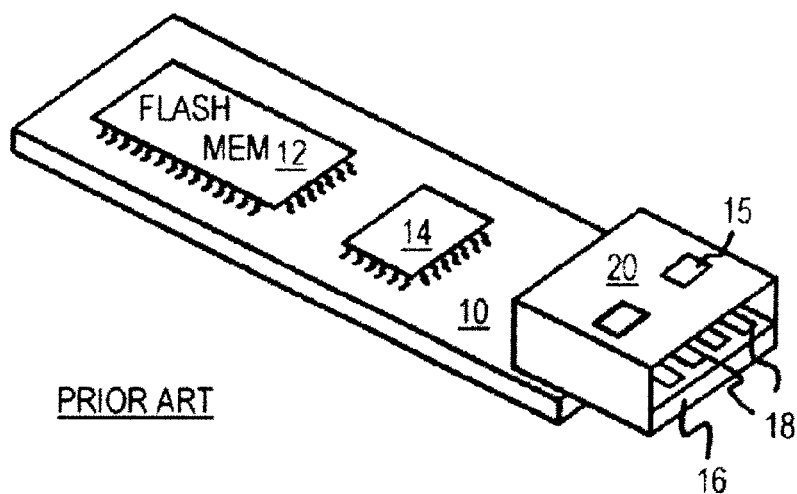
FIG. 24(A) shows a prior-art flash-memory card with a USB connector.
Figure 24B:
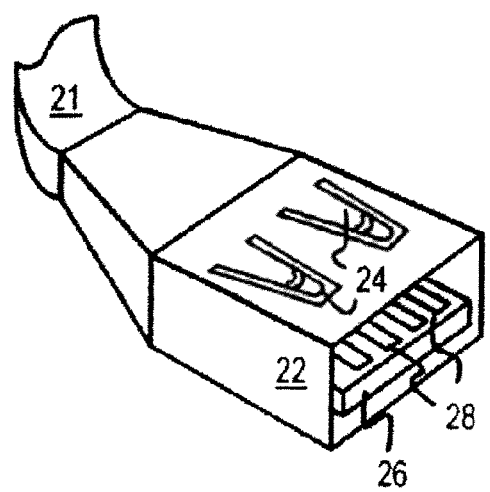
FIG. 24(B) shows a female USB connector.
Figure 26:
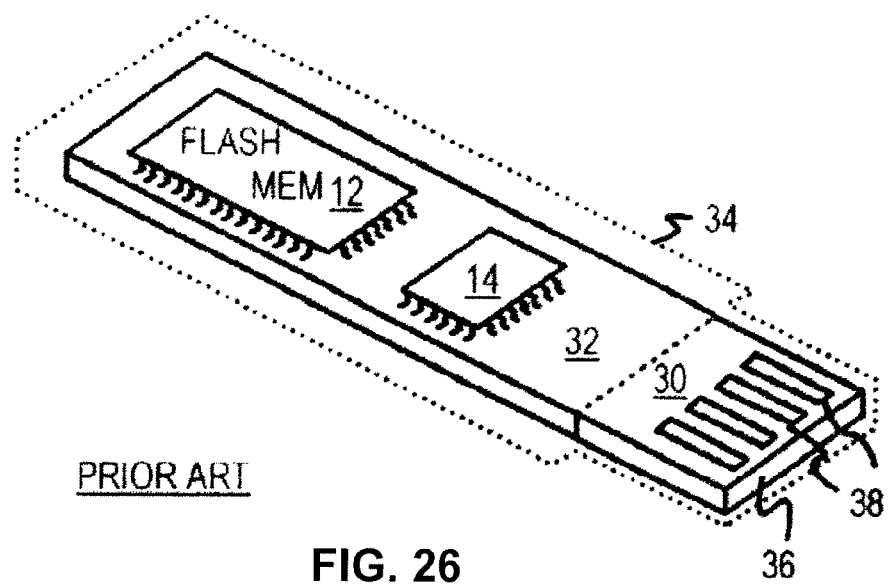
FIG. 26 shows a prior-art USB flash memory card using a low-profile USB connector.
Figure 27A:
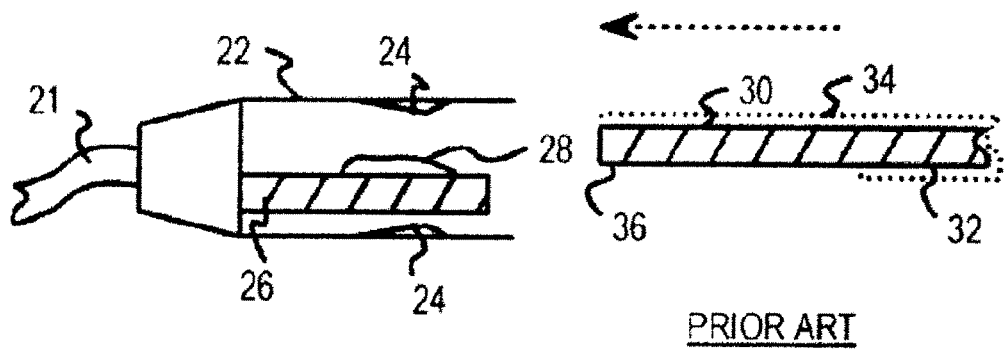
FIGS. 27(A) and 27(B) show cross-sections of the prior-art low-profile USB connector being inserted into a standard Female USB connector.
Figure 27B:
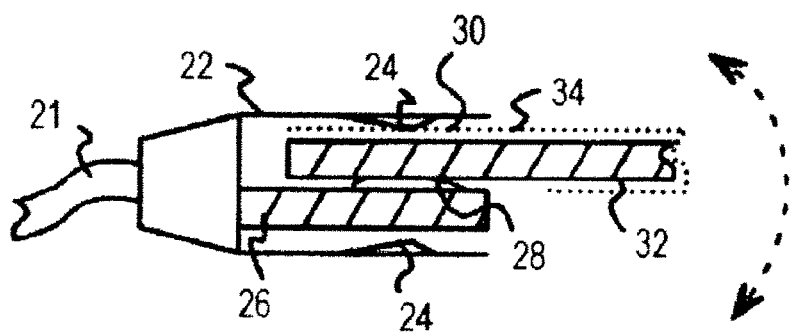

FIG. 21 is an exploded perspective view showing an USB assembly 700 that includes a full metal case 730 mounted over low-profile USB device 100 (which can be replaced using any of the embodiments described above). During assembly low-profile USB device 100 is mounted onto a substrate carrier 710 such that low-profile USB device 100 is supported on a bottom plate 711 between a rear end plate 713 and a front end plate 715, where front end plate 715 includes locking tabs 717. The sub-assembly formed by USB device 100 and carrier 710 is then slid through a front opening 735 defined by walls 731 of metal case 730 until locking tabs 717 are engaged in locking slots 737 (as shown in FIG. 22(A)). Depressions (dimples) 738, which are formed by a crimping tool, press against the sides of USB device 100 to hold USB device 100 in place. An end piece 720 includes a plastic plug structure 721 that presses downward on USB device 100 when pushed through a rear opening 733 of metal case 730. A metal cover piece 723 is molded to plastic plug structure 721, and covers rear opening 733 of metal case 730 when end piece 720 is fully inserted, as shown in FIG. 22(B)). Plastic tabs 729 extend upward from plug structure 721, and are engaged with depressions (dimples) 739 formed on metal case 730 when end piece 720 is fully inserted (as indicated in FIG. 22(B)), thereby locking end piece 720 to metal case 730. FIGS. 22(A) and 22(B) are front and rear perspective views, respectively, showing USB assembly 700 in an assembled state. Note that metal case 730 has a height HI corresponding to the inside height HI of standard female USB socket connector 22 (described above with reference to FIG. 2(A)). Because the height of metal case 730 is greater than that of USB device 100, metal contacts 120 are accessible through front opening 735 defined by metal case 730, which causes metal case to function in a manner similar to standard male USB connector (described above with reference to FIG. 24(A)).

FIGS. 23(A), 23(B) and 23(C) show another USB assembly 800 including a "half" metal case 830 that functions in a manner similar to the embodiment described immediately above, but is slightly lighter and smaller because metal case 830 has only half the length of metal case 730. Similar to assembly 700, USB assembly 800 is assembled by mounting USB device 100A onto a substrate carrier 810 such that USB device 100A is supported on a bottom plate 811 between a rear end plate 813 and a front end plate 815, where front end plate 815 includes locking tabs 817. This sub-assembly is then slid through a front opening 835 defined by walls 831 of metal case 830 until locking tabs 817 are engaged in locking slots 837 (as shown in FIG. 23(B)). An end piece 820 includes a plastic plug structure 821 that presses downward on USB device 100A is then pushed through a rear opening 833 of metal case 830. A metal cover piece 823 is molded to plastic plug structure 821, and covers rear opening 833 of metal case 830 when end piece 820 is fully inserted, as shown in FIG. 23(C)). Plastic tabs 829 extend upward from plug structure 821, and are engaged in locking holes 839 formed on metal case 830 when end piece 820 is fully inserted (as indicated in FIG. 23(C)), thereby locking end piece 820 to metal case 830.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A low-profile Universal-Serial-Bus (USB) device comprising:
    a printed circuit board assembly (PCBA) including:
        a printed circuit board (PCB) including a PCB handle section and a PCB plug section, the PCB having opposing first and second surfaces,
        a plurality of metal contacts disposed on the first surface of the PCB plug section,
        at least one passive component mounted on the second surface of the PCB handle section,
        at least one unpackaged integrated circuit (IC) die mounted on the second surface of the PCB handle section, and
        a plurality of conductive traces formed on the PCB such that each conductive trace is electrically connected to at least one of an associated metal contact, said at least one IC die and said at least one passive component; and
    a single-piece molded housing formed on the second surface of the PCBA such that said at least one passive component and said at least one IC die are covered by said molded housing, and such that substantially all of the first surface of the PCB is exposed.

2. The low-profile USB device of claim 1,
    wherein the molded housing includes a planar surface extending parallel to the PCB and extends from the PCB handle section to the PCB plug section, and
    wherein a first thickness measured between the first surface of the PCB and the planar surface adjacent to the metal contacts is substantially equal to a second thickness between the first surface of the PCB and the planar surface adjacent to the IC die.

3. The low-profile USB device of claim 2, wherein the first thickness is in the range of 1.95 mm to 2.05 mm.

4. The low-profile USB device of claim 2, wherein the molded housing includes a peripheral wall extending perpendicular to the planar surface, and wherein the peripheral wall is aligned with a peripheral edge of the PCB.

5. The low-profile USB device of claim 1, wherein the at least one integrated circuit (IC) die is electrically connected to the conductive traces by a plurality of wire bonds extending between said at least one IC die and corresponding contact pads disposed on the second surface of the PCB.

6. The low-profile USB device of claim 5, wherein the at least one passive component includes a lead that is soldered to a corresponding contact pad disposed on the second surface of the PCB.

7. The low-profile USB device of claim 6, wherein the at least one passive component comprises at least one of a resistor, a capacitor, an oscillator, and a light emitting diode.

8. The low-profile USB device of claim 5, wherein the at least one integrated circuit (IC) die includes a first IC die comprising an USB controller circuit, and a second IC die comprising a flash memory circuit.

9. The low-profile USB device of claim 8, wherein the at least one integrated circuit (IC) die comprises a plurality of flash memory dies disposed in a stacked arrangement such that a first flash memory die is mounted on the second surface of the PCB, and a second flash memory die is mounted on a surface of the first flash memory die.

10. The low-profile USB device of claim 9, wherein the first flash memory die is connected to said PCB by a first plurality of said wire bonds, and the second flash memory die is connected to one of the first flash memory die and said PCB by a second plurality of wire bonds.

11. The low-profile USB device of claim 5, wherein the at least one integrated circuit (IC) die includes a single-chip controller/flash die comprising controller circuit and one or more flash block mass storage circuits that are interconnected by a bus.

12. An Universal-Serial-Bus (USB) assembly comprising:
    a low-profile device including:
        a printed circuit board assembly (PCBA) including a printed circuit board (PCB) having a PCB plug section and opposing first and second surfaces, a plurality of metal contacts disposed on the first surface of the PCB plug section, at least one passive component mounted on the second surface, and at least one unpackaged integrated circuit (IC) die mounted on the second surface of the PCB handle section, and a plurality of conductive traces formed on the PCB such that each conductive trace is electrically connected to at least one of an associated metal contact, the IC die and the passive component, and a single-piece molded housing formed on the second surface of the PCBA such that said at least one passive component and said at least one IC die are covered by said molded housing, and such that substantially all of the first surface of the PCB is exposed; and a metal case fixedly connected to the low-profile device such that the metal case forms a standard USB plug shell around the PCB plug section, and such that the metal contacts are accessible through a front opening of the standard USB plug shell defined by said metal case.

13. The USB assembly of claim 12, wherein the assembly further comprises:

a substrate carrier for supporting the low-profile device between a rear end plate and a front end plate, the substrate carrier being at least partially inserted into the metal case such that the front end plate is substantially aligned with the front opening defined by the metal case; and an end piece inserted into a rear opening of the metal case, wherein the end piece includes a plastic plug structure that presses downward on a rear portion of the USB device, and a metal cover piece that covers rear opening of the metal case.

14. The USB assembly of claim 13, wherein the metal case extends an entire length of the low-profile device such that the entire low-profile device is disposed inside of the metal case.

15. The USB assembly of claim 13, wherein the metal case is shorter the low-profile device such that a portion of the low-profile device extends from the rear opening of the metal case.

16. The USB assembly of claim 13, wherein the metal case comprises depressions that press against at least one of the low-profile device and the end piece, thereby locking the end piece and the low-provide device inside the metal case.

17. The USB assembly of claim 12, wherein the molded housing includes a planar surface extending parallel to the PCB and extends over an entire length of the PCB, and wherein a first thickness measured between the first surface of the PCB and the planar surface adjacent to the metal contacts is substantially equal to a second thickness between the first surface of the PCB and the planar surface adjacent to the at least one IC die.

18. The USB assembly of claim 12, wherein the at least one integrated circuit (IC) die is electrically connected to the conductive traces by a plurality of wire bonds extending between said at least one IC die and corresponding contact pads disposed on the second surface of the PCB.

19. The USB assembly of claim 18, wherein the at least one passive component includes a lead that is soldered to a corresponding contact pad disposed on the second surface of the PCB.

20. The USB assembly of claim 19, wherein the at least one passive component comprises at least one of a resistor, a capacitor, an oscillator, and a light emitting diode.

21. The USB assembly of claim 18, wherein the at least one integrated circuit (IC) die includes a first IC die comprising an USB controller circuit, and a second IC die comprising a flash memory circuit.

22. The USB assembly of claim 21, wherein the at least one IC die comprises a plurality of flash memory dies disposed in a stacked arrangement such that a first flash memory die is mounted on the second surface of the PCB, and a second flash memory die is mounted on a surface of the first flash memory die.

23. The USB assembly of claim 22, wherein the first flash memory die is connected to said PCB by a first plurality of said wire bonds, and the second flash memory die is connected to one of the first flash memory die and said PCB by a second plurality of wire bonds.

24. The USB assembly of claim 18, wherein the at least one integrated circuit (IC) die includes a single-chip controller/flash die comprising controller circuit and one or more flash block mass storage circuits that are interconnected by a bus.

25. A method for producing a Universal-Serial-Bus (USB) device comprising:

producing a printed circuit board (PCB) including opposing first and second surfaces, a plurality of metal contacts disposed on the first surface, a plurality of first contact pads disposed on the second surface, a plurality of second contact pads disposed on the second surface, and a plurality of conductive traces formed on the PCB such that each conductive trace is electrically connected to at least one of an associated metal contact, a first contact pad and a second contact pad;

attaching at least one passive component to the first contact pads using a surface mount technique;

attaching at least one unpackaged integrated circuit (IC) die to the second contact pads using a chip-on-board technique; and forming a single-piece molded housing on the second surface of the PCB such that said at least one passive component and said at least one IC die are covered by said molded housing, and such that substantially all of the first surface of the PCB is exposed.

26. The method of claim 25, wherein attaching said at least one passive component comprises:

printing a solder paste on said first contact pads; mounting said at least one component on said first contact pads; and ref lowing the solder paste such that said at least one component is fixedly soldered to said first contact pads.

27. The method of claim 25, further comprising grinding a wafer including said at least one IC die such that a thickness of said wafer is reduced during said grinding, and then dicing said wafer to provide said at least one IC die.

28. The method of claim 27, wherein attaching at least one IC die comprises bonding said at least one IC die to the second surface of the PCB and wire bonding the at least one IC die to said second contact pad.

29. The method of claim 25, wherein producing the PCB comprises forming a PCB panel including at least eighteen of said PCBs arranged in two rows, and wherein the method further comprises singulating said PCB panel after forming said single-piece molded housing such that the molded housing includes a peripheral wall extending perpendicular to the PCB, and such that the peripheral wall is aligned with a peripheral edge of the PCB.

* * * * *